United States Patent
Mizoguchi et al.

(10) Patent No.: US 10,484,039 B2
(45) Date of Patent: Nov. 19, 2019

(54) MULTIPLEXER, RADIO FREQUENCY FRONT-END CIRCUIT, AND COMMUNICATION DEVICE

(71) Applicant: Murata Manufacturing Co., Ltd., Kyoto (JP)

(72) Inventors: Shinya Mizoguchi, Kyoto (JP); Masanori Higashide, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/199,619

(22) Filed: Nov. 26, 2018

(65) Prior Publication Data

US 2019/0097675 A1 Mar. 28, 2019

Related U.S. Application Data

(63) Continuation of application No. PCT/JP2017/016275, filed on Apr. 25, 2017.

(30) Foreign Application Priority Data

May 27, 2016 (JP) .................................. 2016-106697

(51) Int. Cl.
*H04B 1/44* (2006.01)
*H04B 1/525* (2015.01)
(Continued)

(52) U.S. Cl.
CPC ........... *H04B 1/525* (2013.01); *H01P 1/2056* (2013.01); *H01P 1/213* (2013.01); *H01P 5/227* (2013.01);
(Continued)

(58) Field of Classification Search
CPC ........ H04B 1/525; H04B 1/1036; H04B 1/48; H01P 1/2056; H01P 1/213; H01P 5/227
See application file for complete search history.

(56) References Cited

U.S. PATENT DOCUMENTS 5,878,332 A * 3/1999 Wang ..................... H04B 1/005
455/103
6,356,770 B1 * 3/2002 Ishida .................... H04B 1/005
370/347
(Continued)

FOREIGN PATENT DOCUMENTS

DE 60308344 T2 4/2007
EP 0724337 A2 7/1996
(Continued)

OTHER PUBLICATIONS

International Search Report for International Application No. PCT/JP2017/016275, dated Jul. 25, 2017.
(Continued)

*Primary Examiner* — Md K Talukder
(74) *Attorney, Agent, or Firm* — Pearne & Gordon LLP

(57) ABSTRACT

A duplexer includes a 90° hybrid connected to an antenna terminal, a 90° hybrid connected to a terminating resistor, a transmission-side filter connected to the 90° hybrid connected to the antenna terminal, and notch filters connected to both of the 90° hybrids and mutually having the same filter characteristics, where each of the notch filters is a band elimination filter configured to reflect a radio frequency signal of a transmission band and allow a radio frequency signal of a band other than the transmission band to pass through.

20 Claims, 10 Drawing Sheets

(51) Int. Cl.
  *H01P 1/213* (2006.01)
  *H04B 1/10* (2006.01)
  *H04B 1/48* (2006.01)
  *H01P 1/205* (2006.01)
  *H01P 5/22* (2006.01)
  *H03H 7/46* (2006.01)

(52) U.S. Cl.
  CPC .............. *H04B 1/1036* (2013.01); *H04B 1/48* (2013.01); *H03H 7/463* (2013.01); *H04B 2001/1063* (2013.01)

(56) References Cited

U.S. PATENT DOCUMENTS

| | | | |
|---|---|---|---|
| 6,748,197 B2 | 6/2004 | Lindemann et al. | |
| 7,373,171 B2* | 5/2008 | Nakai | H04B 1/0057 333/100 |
| 7,643,848 B2* | 1/2010 | Robinett | H04B 1/006 455/103 |
| 7,844,231 B2 | 11/2010 | Yoon | |
| 9,042,275 B2 | 5/2015 | Bauder et al. | |
| 9,048,805 B2 | 6/2015 | Granger-Jones et al. | |
| 9,780,437 B2 | 10/2017 | Knox | |
| 9,853,683 B2* | 12/2017 | Khlat | H04L 5/1461 |
| 2003/0045244 A1 | 3/2003 | Lindemann et al. | |
| 2005/0070232 A1 | 3/2005 | Mages | |
| 2005/0245213 A1* | 11/2005 | Hirano | H03F 1/0205 455/127.1 |
| 2007/0096846 A1 | 5/2007 | Mallegol | |
| 2008/0132193 A1* | 6/2008 | Petrovic | H04B 1/28 455/323 |
| 2009/0069053 A1* | 3/2009 | Kim | H01P 1/213 455/561 |
| 2010/0148886 A1 | 6/2010 | Inoue et al. | |
| 2011/0081936 A1* | 4/2011 | Haim | H04W 52/367 455/522 |
| 2013/0244722 A1* | 9/2013 | Rousu | H04B 1/16 455/552.1 |
| 2013/0321097 A1 | 12/2013 | Khlat et al. | |
| 2014/0295909 A1* | 10/2014 | Ouchi | H04W 52/242 455/522 |
| 2014/0376419 A1 | 12/2014 | Goel et al. | |
| 2015/0163044 A1 | 6/2015 | Analui et al. | |
| 2015/0222300 A1 | 8/2015 | Schmidhammer et al. | |
| 2015/0236842 A1 | 8/2015 | Goel et al. | |
| 2017/0317711 A1 | 11/2017 | Jian et al. | |
| 2018/0109243 A1* | 4/2018 | Takamine | H03H 7/38 |
| 2018/0123547 A1* | 5/2018 | Kato | H03H 7/01 |
| 2019/0097675 A1* | 3/2019 | Mizoguchi | H04B 1/1036 |
| 2019/0123722 A1* | 4/2019 | Nosaka | H03H 9/145 |
| 2019/0149121 A1* | 5/2019 | Tani | H03H 7/46 |
| 2019/0149131 A1* | 5/2019 | Kido | H03H 9/25 |
| 2019/0149312 A1* | 5/2019 | Takamine | H03H 9/145 370/273 |
| 2019/0158062 A1* | 5/2019 | Horita | H03H 9/6483 |

FOREIGN PATENT DOCUMENTS

| | | |
|---|---|---|
| JP | 2007-151101 A | 6/2007 |
| JP | 2015-530810 A | 10/2015 |
| WO | 2009/078095 A1 | 6/2009 |
| WO | 2016/063108 A1 | 4/2016 |

OTHER PUBLICATIONS

Written Opinion for International Application No. PCT/JP2017/016275, dated Jul. 25, 2017.

* cited by examiner

MULTIPLEXER, RADIO FREQUENCY FRONT-END CIRCUIT, AND COMMUNICATION DEVICE

This is a continuation of International Application No. PCT/JP2017/016275 filed on Apr. 25, 2017 which claims priority from Japanese Patent Application No. 2016-106697 filed on May 27, 2016. The contents of these applications are incorporated herein by reference in their entireties.

BACKGROUND

Technical Field

The present disclosure relates to multiplexers, radio frequency front-end circuits, and communication devices.

In a mobile communication system, a duplexer for transmitting and receiving a transmission signal and a reception signal without necessarily interference has been mounted not only in a mobile device but also in a base station. Since a transmission signal from a base station consumes larger power than a transmission signal from each mobile device, a duplexer mounted in the base station is particularly required to have high isolation characteristics between transmission and reception signals while securing electric power handling capability.

FIG. 11 is a diagram illustrating a circuit configuration of a duplexer disclosed in Patent Document 1. The duplexer disclosed in the stated diagram includes two hybrids 546 and 550, and two band pass filters 548a and 548b disposed between the hybrids 546 and 550. A transmission signal (Tx) is branched at a terminal "b" of the hybrid 546 and reaches a terminal "d" and a terminal "c". A first branch signal that has reached the terminal d is reflected by the band pass filter 548b and reaches a terminal "a". Further, a second branch signal which has reached the terminal c is reflected by the band pass filter 548a and reaches the terminal a. Since the first branch signal and the second branch signal are in phase with each other at the terminal a, they are combined at the terminal a and outputted to an antenna terminal (TO ANT) through a transmission path 534. On the other hand, a reception signal (Rx) inputted from the antenna terminal is branched at the terminal a of the hybrid 546 and reaches the terminal c and the terminal d. A third branch signal which has reached the terminal c passes through the band pass filter 548a, and reaches a terminal "h" via a terminal "e" of the hybrid 550. Further, a fourth branch signal that has reached the terminal d passes through the band pass filter 548b, and reaches the terminal h via a terminal "f" of the hybrid 550. Since the third branch signal and the fourth branch signal are in phase with each other at the terminal h, they are combined at the terminal h and outputted, through a reception path 542, to a reception amplification circuit (TO LNA). Further, of the transmission signal (Tx), a leakage signal of the first branch signal, which is a signal branched at the terminal b of the hybrid 546, that has passed through the band pass filter 548b reaches the terminal h of the hybrid 550. Of the transmission signal (Tx), a leakage signal of the second branch signal, which is a signal branched at the terminal b of the hybrid 546, that has passed through the band pass filter 548a reaches the terminal h via the terminal e of the hybrid 550. However, since the leakage signal of the first branch signal and the leakage signal of the second branch signal are in anti-phase at the terminal h, the leakage signals cancel out each other.

Thus, the duplexer disclosed in Patent Document 1 achieves high isolation between transmission and reception while transmitting transmission signals and reception signals with low loss.

Patent Document 1: European Patent Application Publication No. 0724337

BRIEF SUMMARY

However, in the existing duplexer described above, in order to achieve high isolation while securing electric power handling capability, two hybrids 546 and 550, and two band pass filters 548a and 548b configured to pass a reception band therethrough and attenuate the bands other than the reception band are disposed. In addition, in order to apply the above duplexer to a front-end circuit, a filter to secure isolation between transmission and reception and a filter to attenuate harmonics may be further required in a transmission path and/or in a reception path. This raises a problem that the circuit configuration becomes large.

As such, the present disclosure provides a multiplexer, a radio frequency front-end circuit and a communication device that are miniaturized, while securing high isolation between two or more signal paths that propagate radio frequency signals of different frequency bands.

A multiplexer according to an aspect of the present disclosure includes: a first 90° hybrid that is connected to an antenna terminal, includes a plurality of transmission lines, and is configured to shift, with respect to a radio frequency signal passing through one transmission line of the plurality of transmission lines, a phase of a radio frequency signal passing through another transmission line by approximately 90 degrees; a second 90° hybrid that is connected to a terminating resistor, includes a plurality of transmission lines, and is configured to shift, with respect to a radio frequency signal passing through one transmission line of the plurality of transmission lines, a phase of a radio frequency signal passing through another transmission line by approximately 90 degrees; a first filter connected to the first 90° hybrid and configured to selectively allow a radio frequency signal of a first pass band to pass through; and a second filter and a third filter connected to both the first 90° hybrid and the second 90° hybrid, and mutually having the same filter characteristics, wherein each of the second filter and the third filter is any one of a band elimination filter configured to reflect a radio frequency signal of the first pass band and allow a radio frequency signal of a band other than the first pass band to pass through, a low-pass filter configured to reflect a radio frequency signal of a radio frequency band including the first pass band and allow a radio frequency signal on a lower frequency side relative to the radio frequency band to pass through, and a high-pass filter configured to reflect a radio frequency signal of a low frequency band including the first pass band and allow a radio frequency signal on a higher frequency side relative to the low frequency band to pass through.

As a multiplexer required to perform demultiplexing on large radio frequency power, there is a configuration in which two 90° hybrids and two filters having the same characteristics are used in order to secure high isolation between two signal paths that propagate radio frequency signals of mutually different frequency bands between an antenna terminal and the hybrids and filters while reducing propagation loss of the two signal paths. According to this configuration, a radio frequency signal propagating across the two signal paths is demultiplexed by the two 90° hybrids to be in anti-phase with each other, so that the stated radio frequency signal is canceled. Further, a radio frequency signal propagating between one signal path and the antenna terminal is demultiplexed by the first 90° hybrid to be in phase with each other, so that the stated radio frequency signal can be propagated with low loss. On the other hand, a radio frequency signal propagating between the other signal path and the antenna terminal is demultiplexed by the first and second 90° hybrids to be in phase with each other, so that the stated radio frequency signal can be propagated with low loss. According to this configuration, since each of the second filter and the third filter disposed between the two 90° hybrids is any one of a band elimination filter, a low-pass filter and a high-pass filter that are configured to reflect a radio frequency signal of the first pass band, the overall multiplexer can be miniaturized while securing high isolation between the above two signal paths, in comparison with a case in which the second filter and the third filter are each constituted of a band pass filter configured to attenuate both a lower frequency side and a higher frequency side of the pass band.

The above-mentioned first 90° hybrid may include a first terminal, a second terminal, a third terminal, and a fourth terminal; in a case where a radio frequency signal inputted to the first terminal is outputted to the third terminal and the fourth terminal, a phase difference between the third terminal and the fourth terminal may be approximately 90 degrees; in a case where a radio frequency signal inputted to the second terminal is outputted to the third terminal and the fourth terminal, the phase difference between the third terminal and the fourth terminal may be approximately 90 degrees; in a case where a radio frequency signal inputted to the third terminal is outputted to the first terminal and the second terminal, a phase difference between the first terminal and the second terminal may be approximately 90 degrees; and in a case where a radio frequency signal inputted to the fourth terminal is outputted to the first terminal and the second terminal, the phase difference between the first terminal and the second terminal may be approximately 90 degrees. Meanwhile, the above-mentioned second 90° hybrid may include a fifth terminal, a sixth terminal, a seventh terminal and an eighth terminal; in a case where a radio frequency signal inputted to the fifth terminal is outputted to the seventh terminal and the eighth terminal, a phase difference between the seventh terminal and the eighth terminal may be approximately 90 degrees; in a case where a radio frequency signal inputted to the sixth terminal is outputted to the seventh terminal and the eighth terminal, the phase difference between the seventh terminal and the eighth terminal may be approximately 90 degrees; in a case where a radio frequency signal inputted to the seventh terminal is outputted to the fifth terminal and the sixth terminal, a phase difference between the fifth terminal and the sixth terminal may be approximately 90 degrees; and in a case where a radio frequency signal inputted to the eighth terminal is outputted to the fifth terminal and the sixth terminal, the phase difference between the fifth terminal and the sixth terminal may be approximately 90 degrees. Further, each of the first filter, the second filter, and the third filter may include a first input-output terminal and a second input-output terminal; the first terminal may be connected to the second input-output terminal of the first filter; the second terminal may be connected to the antenna terminal; the third terminal may be connected to the first input-output terminal of the second filter; the fourth terminal may be connected to the first input-output terminal of the third filter; the sixth terminal may be connected to the terminating resistor; the seventh terminal may be connected to the second input-output terminal of the second filter; and the eighth terminal may be connected to the second input-output terminal of the third filter.

According to the connection configuration described above, a radio frequency signal containing a frequency component of the first pass band passes through the first filter and is branched into a first branch signal and a second branch signal at the first terminal of the first 90° hybrid. The first branch signal propagates to the third terminal, is reflected by the second filter, and then propagates from the third terminal to the second terminal. On the other hand, the second branch signal propagates from the first terminal to the fourth terminal, is reflected by the third filter, and then propagates from the fourth terminal to the second terminal. Here, since the first branch signal and the second branch signal that have reached the second terminal are in phase, the first branch signal and the second branch signal are combined at the second terminal and outputted from the antenna terminal.

Further, a radio frequency signal inputted from the antenna terminal and containing a frequency component of a second pass band different from the first pass band, is branched into a third branch signal and a fourth branch signal at the second terminal of the first 90° hybrid. The third branch signal propagates to the third terminal, passes through the second filter, and then propagates from the seventh terminal of the second 90° hybrid to the fifth terminal. On the other hand, the fourth branch signal propagates from the second terminal to the fourth terminal, passes through the third filter, and then propagates from the eighth terminal to the fifth terminal. Here, since the third branch signal and the fourth branch signal that have reached the fifth terminal are in phase, the third branch signal and the fourth branch signal are combined at the fifth terminal and outputted from the fifth terminal.

Further, a radio frequency signal having passed through the first filter is branched into a fifth branch signal and a sixth branch signal at the first terminal of the first 90° hybrid. The fifth branch signal propagates to the third terminal, passes through the second filter, and then propagates from the seventh terminal to the fifth terminal. On the other hand, the sixth branch signal propagates from the first terminal to the fourth terminal, passes through the third filter, and then propagates from the eighth terminal to the fifth terminal. Here, since the fifth branch signal and the sixth branch signal that have reached the fifth terminal are in anti-phase, the fifth branch signal and the sixth branch signal are canceled at the fifth terminal.

Thus, while eliminating a radio frequency signal propagating between the first terminal and the fifth terminal, it is possible to propagate a radio frequency signal of the first pass band from the first terminal to the antenna terminal with low loss, and propagate a radio frequency signal of the second pass band from the antenna terminal to the fifth terminal with low loss.

Further, each of the second filter and the third filter may be a notch filter configured to reflect a radio frequency signal of the first pass band.

As a result, since each of the second filter and the third filter is constituted of only a resonator for providing an attenuation pole in the first pass band, the overall multiplexer can be further miniaturized compared with a case where the second filter and the third filter are each constituted of a band pass filter.

Each of the first filter, the second filter, and the third filter may be a filter constituted of at least one dielectric resonator.

With this, the above-discussed multiplexer is applicable as a multiplexer disposed in a mobile communication base station or the like, because electric power handling capability is enhanced in comparison with an elastic wave filter frequently used in cellular phone terminals.

Further, the multiplexer may further include a fourth filter formed of a dielectric that is connected to the second 90° hybrid and is configured to selectively allow a radio frequency signal of the second pass band different from the first pass band to pass through; the size of each resonator constituting the first filter, the size of each resonator constituting the second filter, and the size of each resonator constituting the third filter may be substantially equal; the size of each resonator constituting the fourth filter may be equal to or smaller than the size of each resonator constituting the first filter, the size of each resonator constituting the second filter, and the size of each resonator constituting the third resonator; and a total number of the number of resonators constituting the first filter, the number of resonators constituting the second filter, the number of resonators constituting the third filter, and the number of resonators constituting the fourth filter may be smaller than three times the number of resonators constituting the first filter.

Thus, the fourth filter configured to allow the second pass band to pass through and reflect the first pass band is disposed such that the total number of the number of resonators constituting the first filter, the number of resonators constituting the second filter, the number of resonators constituting the third filter and the number of resonators constituting the fourth filter is smaller than three times the number of resonators constituting the first filter. Accordingly, as compared with the case where the second filter and the third filter are each constituted of a band pass filter, even if the fourth filter that enhances bandpass characteristics of the radio frequency signal in the second pass band is disposed, the overall multiplexer can be further reduced in size while securing high isolation of the radio frequency signals of the first pass band and the second pass band.

Further, the size of each resonator constituting the first filter, the size of each resonator constituting the second filter, and the size of each resonator constituting the third filter may be substantially equal; the number of resonators in each of the second filter and the third filter may be smaller than the number of resonators in the first filter; and there may be further provided a fourth filter of a surface acoustic wave type that is connected to the second 90° hybrid and is configured to selectively allow a radio frequency signal of the second pass band different from the first pass band to pass through.

Thus, a band pass filter configured to allow the second pass band to pass through and attenuate the first pass band is not disposed between the first 90° hybrid and the second 90° hybrid, but can be disposed as the small fourth filter at a location where high electric power handling capability is not required. Accordingly, as compared with the case where the second filter and the third filter are each constituted of a band pass filter, even if the fourth filter that enhances bandpass characteristics of the radio frequency signal in the second pass band is disposed, the overall multiplexer can be further reduced in size while securing high isolation of the radio frequency signals of the first pass band and the second pass band.

Further, there may be provided a mounting board on which the first and second 90° hybrids, the first filter, the second filter, the third filter, and the fourth filter are mounted; the antenna terminal, a first external connection terminal connected to the first filter, and a second external connection terminal connected to the fourth filter may be disposed on the mounting board; and of the first and second 90° hybrids, the first filter, the second filter, the third filter and the fourth filter, the fourth filter may be disposed closest to the second external connection terminal in a plan view of the mounting board (viewed in a direction perpendicular to a mounting surface of the mounting board).

With this, it is possible to reduce the length of wiring connecting the fourth filter and the second external connection terminal, and thus it is possible to reduce the area of the mounting board and reduce the propagation loss between the antenna terminal and the second external connection terminal.

Furthermore, there may be provided a mounting board on which the first and second 90° hybrids, the first filter, the second filter, and the third filter are mounted; each of the first and second 90° hybrids, the first filter, the second filter, and the third filter may be formed in a rectangular shape in a plan view of the mounting board; in the stated plan view, (1) the first filter, (2) the second filter, (3) the first and second 90° hybrids, and (4) the third filter may be disposed in that order in a longitudinal direction of the mounting board; a long side of the first filter, a short side of the second filter, and a short side of the third filter may be arranged substantially parallel to the above-mentioned longitudinal direction; and the second filter and the third filter may be disposed such that a distance between input terminals of the second filter and the third filter and a distance between output terminals of the second filter and the third filter become the shortest across the first and second 90° hybrids.

As a result, the total length of wiring connecting the second filter, the third filter and the first and second 90° hybrids can be shortened, so that the area of the mounting board can be reduced and the propagation loss of the radio frequency signal passing through the multiplexer can be reduced.

In addition, the first filter and the second filter may be disposed such that a distance between a short side of the first filter and a long side of the second filter opposing each other becomes the shortest.

As a result, because the first filter, the second filter, the third filter and the first and second 90° hybrids are all disposed at the shortest distance from each other, the area of the mounting board can be further reduced and the propagation loss of the radio frequency signal passing through the multiplexer can be further reduced.

Further, each length of the long side of the second filter and a long side of the third filter may be equal to or shorter than the length of the short side of the first filter.

Thus, by making a dimension in a short side direction of the mounting board substantially equal to that of the short side of the first filter, it is possible to reduce a region opposing the long side of the first filter, thereby making it possible to reduce the area of the mounting board.

In addition, the antenna terminal may be disposed on the mounting board, and the antenna terminal may be disposed between the second filter and the third filter in a plan view of the mounting board.

Thus, since the length of the wiring connecting the antenna terminal and the first 90° hybrid can be shortened, the area of the mounting board can be reduced and the propagation loss between the antenna terminal and the first 90° hybrid can be reduced.

Furthermore, there may be provided a mounting board on which the first and second 90° hybrids, the first filter, the second filter, and the third filter are mounted; each of the first and second 90° hybrids, the first filter, the second filter, and the third filter may be formed in a rectangular shape in a plan view of the mounting board; in the stated plan view, (1) the first filter, (2) the first 90° hybrid, (3) the second filter and the third filter, and (4) the second 90° hybrid may be disposed in that order in the longitudinal direction of the mounting board; the long side of the first filter, the long side of the second filter, and the long side of the third filter may be arranged substantially parallel to the longitudinal direction; and the long side of the second filter and the long side of the third filter may be arranged opposing each other in such a manner that the distance between the input terminals of the second filter and the third filter and the distance between the output terminals of the second filter and the third filter become the shortest.

As a result, the total length of wiring connecting the second filter, the third filter and the first and second 90° hybrids can be shortened, so that the area of the mounting board can be reduced and the propagation loss of the radio frequency signal passing through the multiplexer can be reduced.

Further, the first filter and the first 90° hybrid may be disposed such that a distance between the first filter and the first 90° hybrid becomes the shortest.

As a result, because the first filter, the second filter, the third filter and the first and second 90° hybrids are all disposed at the shortest distance from each other, the area of the mounting board can be further reduced and the propagation loss of the radio frequency signal passing through the multiplexer can be further reduced.

In addition, each length of the long side of the second filter and the long side of the third filter may be longer than the length of the short side of the first filter.

Thus, by making the dimension in the short side direction of the mounting board substantially equal to a length of the short side of the second filter and the short side of the third filter being combined, a region opposing the long side of the first filter can be reduced, so that the area of the mounting board can be reduced.

Further, the antenna terminal may be disposed on the mounting board, and the antenna terminal may be disposed between the second and third filters and the first filter in a plan view of the mounting board.

Thus, since the length of the wiring connecting the antenna terminal and the first 90° hybrid can be shortened, the area of the mounting board can be reduced and the propagation loss between the antenna terminal and the first 90° hybrid can be reduced.

Furthermore, there may be provided a mounting board on which the first and second 90° hybrids, the first filter, the second filter, and the third filter are mounted; each of the first and second 90° hybrids, the first filter, the second filter, and the third filter may be formed in a rectangular shape in a plan view of the mounting board; in the stated plan view, the second filter, the third filter, and the first and second 90° hybrids may be disposed in a region opposing the long side of the first filter; the second filter and the third filter may be disposed between the first 90° hybrid and the second 90° hybrid; and the long side of the second filter and the long side of the third filter may be arranged opposing each other in such a manner that the distance between the input terminals of the second filter and the third filter and the distance between the output terminals of the second filter and the third filter become the shortest.

As a result, the total length of wiring connecting the second filter, the third filter and the first and second 90° hybrids can be shortened, so that the area of the mounting board can be reduced and the propagation loss of the radio frequency signal passing through the multiplexer can be reduced.

Further, the first filter and the second filter may be disposed such that the distance between the first filter and the second filter becomes the shortest.

As a result, because the first filter, the second filter, the third filter and the first and second 90° hybrids are all disposed at the shortest distance from each other, the area of the mounting board can be further reduced and the propagation loss of the radio frequency signal passing through the multiplexer can be further reduced.

In addition, the antenna terminal may be disposed on the mounting board; and of the first and second 90° hybrids, the first filter, the second filter and the third filter, the first 90° hybrid may be disposed closest to the antenna terminal in the above-mentioned plan view.

Thus, since the length of the wiring connecting the antenna terminal and the first 90° hybrid can be shortened, the area of the mounting board can be reduced and the propagation loss between the antenna terminal and the first 90° hybrid can be reduced.

Moreover, an aspect of the present disclosure may be a radio frequency front-end circuit including: a multiplexer having the above-discussed characteristic constitution; a transmission amplification circuit connected to a transmission terminal included in the multiplexer; and a reception amplification circuit connected to a reception terminal included in the multiplexer.

According to the above configuration, it is possible to provide a miniaturized radio frequency front-end circuit while securing high isolation between transmission and reception.

In addition, an aspect of the present disclosure may be a communication device including: a radio frequency front-end circuit having the above-discussed characteristic constitution; and an RF signal processing circuit configured to output a radio frequency transmission signal to the radio frequency front-end circuit and input a radio frequency reception signal from the radio frequency front-end circuit.

According to the above configuration, it is possible to provide a miniaturized communication device while securing high isolation between transmission and reception.

A multiplexer according to an aspect of the present disclosure includes: a first 90° hybrid that is connected to an antenna terminal, includes a plurality of transmission lines, and is configured to shift, with respect to a radio frequency signal passing through one transmission line of the plurality of transmission lines, a phase of a radio frequency signal passing through another transmission line by approximately 90 degrees; a second 90° hybrid that is connected to a terminating resistor, includes a plurality of transmission lines, and is configured to shift, with respect to a radio frequency signal passing through one transmission line of the plurality of transmission lines, a phase of a radio frequency signal passing through another transmission line by approximately 90 degrees; a first filter connected to the second 90° hybrid and configured to selectively allow a radio frequency signal of a first pass band to pass through; and a second filter and a third filter connected to both the first 90° hybrid and the second 90° hybrid, and mutually having the same filter characteristics, wherein each of the second filter and the third filter is any one of a band elimination filter configured to reflect a radio frequency signal of a second pass band different from the first pass band and allow a radio frequency signal of a band other than the second pass band to pass through, a low-pass filter configured to reflect a radio frequency signal of a radio frequency band including the second pass band and allow a radio frequency signal on a lower frequency side relative to the radio frequency band to pass through, and a high-pass filter configured to reflect a radio frequency signal of a low frequency band including the second pass band and allow a radio frequency signal on a higher frequency side relative to the low frequency band to pass through.

According to this configuration, since each of the second filter and the third filter disposed between the two 90° hybrids is any one of the band elimination filter, the low-pass filter and the high-pass filter that are configured to reflect a radio frequency signal of the second pass band, the overall multiplexer can be miniaturized while securing high isolation between the above two signal paths, in comparison with a case in which the second filter and the third filter are each constituted of a band pass filter configured to attenuate both a lower frequency side and a higher frequency side of the pass band.

According to the present disclosure, since a filter configuration connected to two 90° hybrids is simplified, it is possible to provide a multiplexer, a radio frequency front-end circuit, and a communication device that are reduced in size while securing high isolation between two or more signal paths in which radio frequency signals of different frequency bands are propagated.

DETAILED DESCRIPTION

Figure 1:
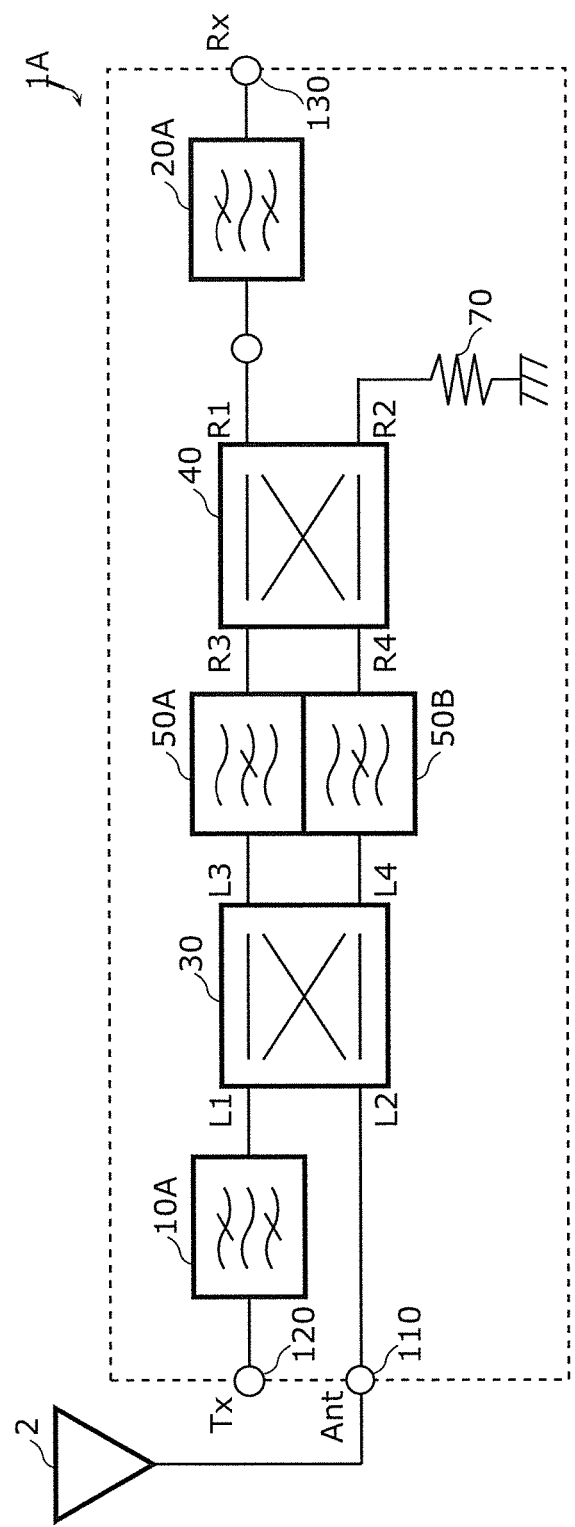
FIG. 1 is a circuit configuration diagram of a duplexer according to a first embodiment.

Hereinafter, embodiments of the present disclosure will be described in detail with reference to working examples and the drawings. Note that each of the embodiments described below represents a comprehensive or specific example. Numerical values, shapes, materials, constituent elements, arrangements and connection modes of the constituent elements, and the like indicated in the following embodiments are merely examples, and are not intended to limit the present disclosure. Of the constituent elements in the following embodiments, those that are not described in the independent claims will be described as arbitrary constituent elements. In addition, the size or size ratio of the constituent elements illustrated in the drawings is not necessarily strict.

First Embodiment

[1.1 Multiplexer Circuit Configuration]

FIG. 1 is a circuit configuration diagram of a duplexer 1A according to a first embodiment. In the diagram, an antenna element 2 and the duplexer 1A are illustrated. The duplexer 1A is disposed, for example, in a base station of a mobile communication system or in a front-end portion of a cellular phone.

The duplexer 1A is a kind of multiplexer, and includes a transmission-side filter 10A, a reception-side filter 20A, 90° hybrid couplers (hereinafter "hybrids") 30 and 40, notch filters 50A and 50B, a terminating resistor 70, an antenna terminal 110, a transmission terminal 120, and a reception terminal 130. With the above configuration, the duplexer 1A outputs, from the antenna terminal 110, a radio frequency transmission signal inputted from the transmission terminal 120, and outputs, from the reception terminal 130, a radio frequency reception signal inputted from the antenna terminal 110. The duplexer 1A has a function capable of transmitting and receiving the radio frequency transmission signal and the radio frequency reception signal at the same time without necessarily interference. Hereinafter, each constituent element of the duplexer 1A will be described.

The 90° hybrid 30 is a first 90° hybrid that is connected to the antenna terminal 110, includes a plurality of transmission lines, and shifts, with respect to a radio frequency signal passing through one transmission line of the plurality of transmission lines, a phase of a radio frequency signal passing through another transmission line by approximately 90 degrees.

The 90° hybrid 40 is a second 90° hybrid that is connected to the terminating resistor 70, includes a plurality of transmission lines, and shifts, with respect to a radio frequency signal passing through one transmission line of the plurality of transmission lines, a phase of a radio frequency signal passing through another transmission line by approximately 90 degrees.

More specifically, the 90° hybrid 30 includes a terminal L1 (first terminal), a terminal L2 (second terminal), a terminal L3 (third terminal), and a terminal L4 (fourth terminal). When a radio frequency signal inputted to the terminal L1 is outputted to the terminal L3 and the terminal L4, a phase difference between the terminal L3 and the terminal L4 is approximately 90 degrees. When a radio frequency signal inputted to the terminal L2 is outputted to the terminal L3 and the terminal L4, the phase difference between the terminal L3 and the terminal L4 is approximately 90 degrees. When a radio frequency signal inputted to the terminal L3 is outputted to the terminal L1 and the terminal L2, a phase difference between the terminal L1 and the terminal L2 is approximately 90 degrees. When a radio frequency signal inputted to the terminal L4 is outputted to the terminal L1 and the terminal L2, the phase difference between the terminal L1 and the terminal L2 is approximately 90 degrees. In addition, the amplitude of the radio frequency signal outputted as described above is −3 dB with respect to the amplitude of the inputted radio frequency signal.

The 90° hybrid 40 includes a terminal R1 (fifth terminal), a terminal R2 (sixth terminal), a terminal R3 (seventh terminal), and a terminal R4 (eighth terminal). When a radio frequency signal inputted to the terminal R1 is outputted to the terminal R3 and the terminal R4, a phase difference between the terminal R3 and the terminal R4 is approximately 90 degrees. When a radio frequency signal inputted to the terminal R2 is outputted to the terminal R3 and the terminal R4, the phase difference between the terminal R3 and the terminal R4 is approximately 90 degrees. When a radio frequency signal inputted to the terminal R3 is outputted to the terminal R1 and the terminal R2, a phase difference between the terminal R1 and the terminal R2 is approximately 90 degrees. When a radio frequency signal inputted to the terminal R4 is outputted to the terminal R1 and the terminal R2, the phase difference between the terminal R1 and the terminal R2 is approximately 90 degrees. In addition, the amplitude of the radio frequency signal outputted as described above is −3 dB with respect to the amplitude of the inputted radio frequency signal. From the above transmission characteristics, the 90° hybrids 30 and 40 are each also referred to as a three-dB coupler.

The transmission-side filter 10A is a first filter, one terminal of which (second input-output terminal) is connected to the terminal L1 of the 90° hybrid 30, that is configured to selectively allow a radio frequency signal of a transmission band (first pass band) to pass through. The transmission-side filter 10A is, for example, a band pass filter constituted of a dielectric resonator including at least one resonator.

The notch filter 50A is a second filter in which one terminal (first input-output terminal) is connected to the terminal L3 of the 90° hybrid 30 and the other terminal (second input-output terminal) is connected to the terminal R3 of the 90° hybrid 40.

The notch filter 50B is a third filter in which one terminal (first input-output terminal) is connected to the terminal L4 of the 90° hybrid 30, and the other terminal (second input-output terminal) is connected to the terminal R4 of the 90° hybrid 40.

The notch filters 50A and 50B are notch filters that have the same filter characteristics in which a single attenuation pole is provided in the transmission band (first pass band), and are configured to reflect the radio frequency signal of the transmission band, and allow the radio frequency signal of the band other than the transmission band to pass through. The notch filters 50A and 50B are each constituted of, for example, a dielectric resonator including at least one resonator.

Since it is sufficient that the notch filters 50A and 50B (the second filter and the third filter) provide only the attenuation pole corresponding to the transmission band (first pass band) as described above, the number of stages of dielectric coaxial resonators (the number of resonators) for forming the attenuation pole may be smaller than that in the transmission-side filter 10A. The transmission-side filter 10A has a size equivalent to that of the band pass filters 548*a* and 548*b* described in the existing technique (Patent Document 1) (that is, the number of resonators and the size of the resonators are equivalent to those of the existing technique). From this relationship, the number of stages of the dielectric coaxial resonators in each of the notch filters 50A and 50B (the second and third filters) is smaller than that in each of the band pass filters 548*a* and 548*b* of the existing technique (Patent Document 1). In addition, there is a size of 70 square millimeters (7 mm×10 mm) as a size of a single dielectric coaxial resonator.

Note that a situation in which the filter characteristics of the notch filters 50A and 50B are the same is not limited to a case in which the filter characteristics of the notch filters 50A and 50B are completely identical to each other. For example, such a case is also included in the above situation that there is an error in the characteristics due to a variation in manufacturing, or there is a difference in the characteristics in a frequency band other than the frequency bands to be the transmission band and the reception band, or the like.

The reception-side filter 20A is a fourth filter, one terminal of which is connected to the terminal R1 of the 90° hybrid 40, that is configured to selectively allow a radio frequency signal of a reception band (second pass band) to pass through.

The reception-side filter 20A is, for example, a band pass filter formed of a dielectric that is configured to selectively allow a radio frequency signal of the reception band to pass through, and the number of stages of dielectric resonators constituting the reception-side filter 20A is smaller than the number of stages of resonators constituting the transmission-side filter 10A. Even if the number of stages of the dielectric resonators in the reception-side filter 20A is equal to or larger than the number of stages of the resonators in the transmission-side filter 10A, it is sufficient for the reception-side filter 20A to be smaller in size than the transmission-side filter 10A.

In a case where the two band pass filters 548*a* and 548*b* of the existing technique (Patent Document 1) are dielectric band pass filters, the duplexer of the existing technique additionally needs a transmission filter corresponding to the transmission-side filter 10A (the first filter) of the present embodiment in order to attenuate signals other than the transmission signal. This transmission filter requires a size equivalent to that of the band pass filter 548*a* or 548*b*. This is because, since attenuation equivalent to that of the reception signal is required for the transmission signal, the number of resonators of the transmission filter and the size of each resonator thereof respectively need to be equivalent to the number of resonators of the reception filter and the size of each resonator thereof. In other words, in the existing technique, three filters having the same characteristics and the same size as those of the transmission-side filter 10A (first filter) are required.

In contrast, in the duplexer 1A according to the present embodiment, the size of each resonator of the transmission-side filter 10A and the notch filters 50A, 50B is substantially equal, and the size of each resonator of the reception-side filter 20A is equal to or smaller than the size of each resonator of the transmission-side filter 10A and the notch filters 50A, 50B. Further, as described above, the number of stages of the dielectric coaxial resonators in each of the notch filters 50A and 50B may be smaller than that in the transmission-side filter 10A.

From this relationship, in the duplexer 1A according to the present embodiment, even in a case where the reception-side filter 20A (the fourth filter) is added, it is possible to achieve the same characteristics as those of the existing technique and achieve downsizing compared with the existing technique when Expression 1 given below is satisfied.

(The number of resonators of the transmission-side filter 10A)+(the number of resonators of the notch filter 50A)+(the number of resonators of the notch filter 50B)+(the number of resonators of the reception-side filter 20A)<(the number of resonators of the transmission-side filter 10A)×3 (Expression 1)

In other words, according to the relationship of Expression 1, even in the case where the reception-side filter 20A (fourth filter), which enhances the bandpass characteristics of the radio frequency signal of the second pass band, is disposed, the overall multiplexer can be further miniaturized while securing high isolation for the radio frequency signals of the first pass band and the second pass band, in comparison with the existing technique.

In this embodiment, the reception-side filter 20A (fourth filter) can be smaller than the transmission-side filter 10A (first filter) because the duplexer 1A can be further miniaturized.

Further, the reception-side filter 20A (fourth filter) may be, for example, a surface acoustic wave filter configured to selectively pass the radio frequency signal of the reception band therethrough.

In this case, a typical size of the reception-side filter 20A is equal to or smaller than nine square millimeters (3 mm×3 mm).

In a case where the two band pass filters 548a and 548b of the existing technique (Patent Document 1) are dielectric band pass filters, the duplexer of the existing technique additionally needs a transmission filter corresponding to the transmission-side filter 10A (the first filter) of the present embodiment in order to attenuate signals other than the transmission signal. This transmission filter requires a size equivalent to that of the band pass filter 548a or 548b. This is because, since attenuation equivalent to that of the reception signal is required for the transmission signal, the number of resonators of the transmission filter and the size of each resonator thereof respectively need to be equivalent to the number of resonators of the reception filter and the size of each resonator thereof.

As described above, the size of each of the notch filters 50A and 50B (the second and third filters) is equivalent to the size of each resonator of the band pass filters 548a and 548b of the existing technique. Further, since the number of stages of the dielectric coaxial resonators (the number of resonators) in each of the notch filters 50A and 50B (the second and third filters) is smaller than that in each of the band pass filters 548a and 548b of the existing technique, the number of stages of the dielectric coaxial resonators in the present embodiment is smaller than that in the existing technique by at least two stages.

Then, since the size of a single dielectric coaxial resonator is 70 square millimeters (7 mm×10 mm), and the size of the surface acoustic wave reception-side filter 20A is nine square millimeters (3 mm×3 mm), the size of the surface acoustic wave reception-side filter 20A is smaller than that of the single dielectric coaxial resonator.

Therefore, in the case where a surface acoustic wave filter is used for the reception-side filter 20A, the total size of the duplexer 1A can be reduced as compared with the existing technique.

The antenna terminal 110 is connected to the terminal L2 of the 90° hybrid 30 and to the antenna element 2.

The terminating resistor 70 is connected to the terminal R2 of the 90° hybrid 40 and to a ground terminal.

Note that an impedance matching circuit may be inserted between the terminating resistor 70 and the terminal R2, and the impedance value of the terminating resistor 70 is not limited to 50Ω. Further, an impedance matching circuit may be disposed instead of the terminating resistor 70.

Note that it may be unnecessary for each of the notch filters 50A and 50B to be a notch filter having filter characteristics in which a single attenuation pole is provided; each of them may be a band elimination filter having filter characteristics in which a predetermined attenuation band is provided, and configured to reflect a radio frequency signal of the transmission band and allow a radio frequency signal of the band other than the transmission band to pass through. Further, each of the notch filters 50A and 50B may be a low-pass filter configured to reflect a radio frequency signal of a radio frequency band including the transmission band and allow a radio frequency signal on a lower frequency side relative to the radio frequency band to pass through, or may be a high-pass filter configured to reflect a radio frequency signal of a low frequency band including the transmission band and allow a radio frequency signal on a higher frequency side relative to the low frequency band to pass through.

In addition, the reception-side filter 20A may not be present depending on the requirement specifications for the present multiplexer.

With the above configuration, a radio frequency signal propagating across a transmission path and a reception path is so demultiplexed by the 90° hybrids 30 and 40 as to be in anti-phase with each other, whereby the stated radio frequency signal is canceled. On the other hand, a radio frequency transmission signal propagated to the antenna terminal 110 through the transmission path is so demultiplexed by the 90° hybrid 30 as to be in phase with each other, whereby the stated radio frequency transmission signal can be propagated with low loss. Further, a radio frequency reception signal propagated from the antenna terminal 110 through the reception path is so demultiplexed by the 90° hybrids 30 and 40 as to be in phase with each other, whereby the stated radio frequency reception signal can be propagated with low loss. According to this configuration, since each of the notch filters 50A and 50B is any one of a band elimination filter, a low-pass filter, and a high-pass filter that are configured to reflect the radio frequency signal of the transmission band, it is possible to reduce the size of the duplexer 1A while securing high isolation between the transmission and reception, as compared with a case where the two filters between the 90° hybrids 30 and 40 are configured by band pass filters.

In the duplexer 1A according to the present embodiment, a matching circuit may be disposed between the 90° hybrid 30 and the notch filters 50A and 50B, or between the 90° hybrid 40 and the notch filters 50A and 50B. This matching circuit is, for example, a phase adjuster, an attenuator or the like, and has a function of adjusting the phase balance and the amplitude balance between the signal path passing through the notch filter 50A and the signal path passing through the notch filter 50B.

[1.2 Multiplexer Circuit Configuration According to Variation]

Figure 2:
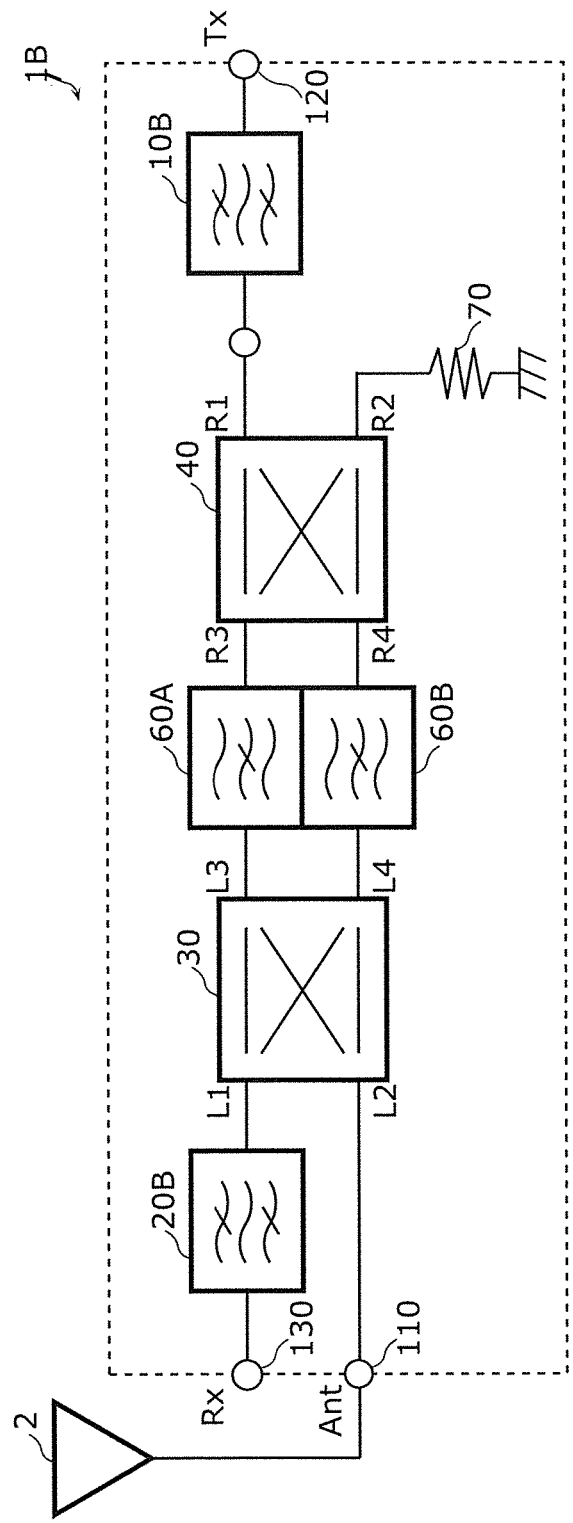
FIG. 2 is a circuit configuration diagram of a duplexer according to a variation on the first embodiment.

FIG. 2 is a circuit configuration diagram of a duplexer 1B according to a variation on the first embodiment. The duplexer 1B according to the variation is different from the duplexer 1A according to the first embodiment in that a transmission terminal and a transmission-side filter, and a reception terminal and a reception-side filter are disposed being positionally reversed. Hereinafter, with respect to the duplexer 1B according to the present variation, the same configurations as those of the duplexer 1A according to the first embodiment will not be described, and description will be given mainly on different configurations.

In FIG. 2, an antenna element 2 and a duplexer 1B are illustrated. The duplexer 1B is a type of multiplexer, and includes a transmission-side filter 10B, a reception-side filter 20B, 90° hybrids 30 and 40, notch filters 60A and 60B, a terminating resistor 70, an antenna terminal 110, a transmission terminal 120, and a reception terminal 130. With this configuration, the duplexer 1B outputs, from the antenna terminal 110, a radio frequency transmission signal inputted from the transmission terminal 120, and outputs, from the reception terminal 130, a radio frequency reception signal inputted from the antenna terminal 110.

The reception-side filter 20B is a fourth filter, one terminal of which (second input-output terminal) is connected to a terminal L1 of the 90° hybrid 30, that is configured to selectively allow a radio frequency signal of a reception band (second pass band) to pass through. The reception-side filter 20B is, for example, a band pass filter constituted of a dielectric resonator including at least one resonator. Further, the reception-side filter 20B may be, for example, a surface acoustic wave filter configured to selectively allow a radio frequency signal of the reception band to pass through.

The notch filter 60A is a second filter, one terminal of which (first input-output terminal) is connected to a terminal L3 of the 90° hybrid 30, and the other terminal of which (second input-output terminal) is connected to a terminal R3 of the 90° hybrid 40.

The notch filter 60B is a third filter, one terminal of which (first input-output terminal) is connected to a terminal L4 of the 90° hybrid 30, and the other terminal of which (second input-output terminal) is connected to a terminal R4 of the 90° hybrid 40.

The notch filters 60A and 60B are notch filters that have the same filter characteristics in which a single attenuation pole is provided in the reception band (second pass band), and are configured to reflect the radio frequency signal of the reception band and allow the radio frequency signal of the band other than the reception band to pass through. The notch filters 60A and 60B are each configured of, for example, a dielectric resonator including at least one resonator.

Figure 11:
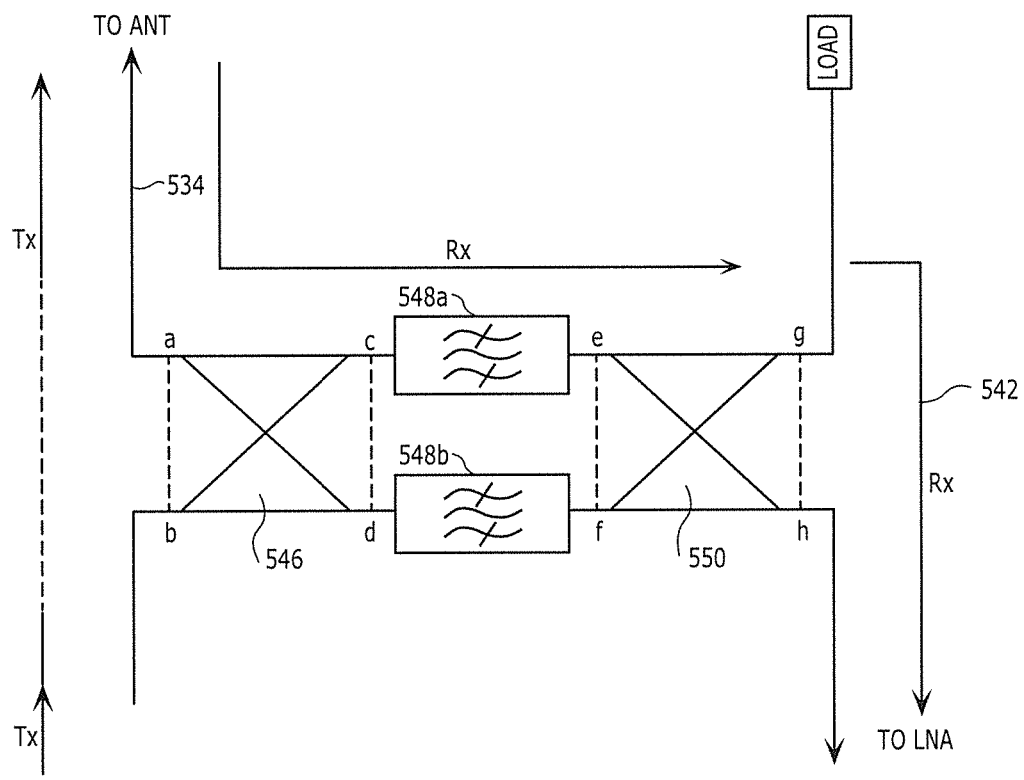
FIG. 11 is a diagram illustrating a circuit configuration of a duplexer disclosed in Patent Document 1.

The circuit connection configuration of the duplexer according to the existing technique illustrated in FIG. 11 corresponds to the circuit connection configuration of the duplexer 1A according to the first embodiment illustrated in FIG. 1. Accordingly, as an existing technique corresponding to the circuit connection configuration of the duplexer 1B according to FIG. 2, a configuration in which the band pass filters 548a and 548b are transmission filters in FIG. 11 can be given.

Here, since it is sufficient that the notch filters 60A and 60B (the second and third filters) provide only the attenuation pole corresponding to the reception band (second pass band) as described above, the number of stages of the dielectric coaxial resonators for forming the attenuation pole may be smaller than that of the reception-side filter 20B. Note that the reception-side filter 20B has a size equal to that of the band pass filters 548a and 548b described in the existing technique (the number of resonators and the resonator size are substantially equal to those of the existing technique). From this relationship, the number of stages of the dielectric coaxial resonator in each of the notch filters 60A and 60B (the second and third filters) is smaller than that in each of the band pass filters 548a and 548b of the existing technique. In addition, as a size of a single dielectric coaxial resonator, there is a size of 70 square millimeters (7 mm×10 mm).

Note that a situation in which the filter characteristics of the notch filters 60A and 60B are the same is not limited to a case in which the filter characteristics of the notch filters 60A and 60B are completely identical to each other. For example, such a case is also included in the above situation that there is an error in the characteristics due to a variation in manufacturing, or there is a difference in the characteristics in a frequency band other than the frequency bands to be the transmission band and the reception band, or the like.

The transmission-side filter 10B is a first filter, one terminal of which is connected to a terminal R1 of the 90° hybrid 40, that is configured to selectively allow a radio frequency signal of the transmission band (first pass band) to pass through.

The transmission-side filter 10B is, for example, a band pass filter formed of a dielectric that is configured to selectively pass the radio frequency signal of the transmission band therethrough, and the number of stages of the dielectric resonators constituting the transmission-side filter 10B is smaller than the number of stages of the resonators constituting the reception-side filter 20B.

In the case where the two band pass filters 548a and 548b of the existing technique are dielectric band pass filters, the duplexer of the existing technique additionally needs a reception filter corresponding to the reception-side filter 20B (fourth filter) of the present variation in order to attenuate signals other than the reception signal. This reception filter needs to have a size substantially equal to the size of the band pass filter 548a or 548b. This is because, since attenuation equivalent to that of the transmission signal is required for the reception signal, the number of resonators of the reception filter and the size of each resonator thereof respectively need to be substantially equal to the number of resonators of the transmission-side filter and the size of each resonator thereof. In other words, in the existing technique, three filters having the same characteristics and the same size as those of the reception-side filter 20B (fourth filter) are needed.

In contrast, in the duplexer 1B according to the present variation, the size of each resonator of the reception-side filter 20B, the notch filters 60A and 60B, and the transmission-side filter 10B is substantially equal, and further, the number of stages of the dielectric coaxial resonators in each of the notch filters 60A and 60B may be smaller than that in the reception-side filter 20B as described above.

From this relationship, in the duplexer 1B according to the present variation, even in a case where the reception-side filter 20B (fourth filter) is added, it is possible to achieve the same characteristics as those of the existing technique and achieve downsizing compared with the existing technique when Expression 2 given below is satisfied.

(The number of resonators of the reception-side filter 20B)+(the number of resonators of the notch filter 60A)+(the number of resonators of the notch filter 60B)+(the number of resonators of the transmission-side filter 10 B)<(the number of resonators of the reception-side filter 20B)×3 (Expression 2)

In other words, according to the relationship of Expression 2 described above, even in the case where the transmission-side filter 10B (first filter), which enhances the bandpass characteristics of the radio frequency signal of the first pass band, is disposed, it is possible to further reduce the size of the overall multiplexer while securing high isolation for the radio frequency signals of the first pass band and the second pass band, in comparison with the above-discussed existing technique.

Further, the reception-side filter 20B (fourth filter) may be, for example, a surface acoustic wave filter configured to selectively allow the radio frequency signal of the reception band to pass through.

In this case, a typical size of the reception-side filter 20B is equal to or smaller than nine square millimeters (3 mm×3 mm).

In the case where the two band pass filters 548a and 548b of the existing technique (Patent document 1) are dielectric band pass filters, the duplexer of the existing technique additionally needs a reception filter corresponding to the reception-side filter 20B (fourth filter) of the present embodiment in order to attenuate signals other than the reception signal. This reception filter needs to have a size equivalent to the size of the band pass filter 548a or 548b. This is because, since attenuation equivalent to that of the transmission signal is required for the reception signal, the number of resonators of the reception filter and the size of each resonator thereof respectively need to be equal to the number of resonators of the transmission filter and the size of each resonator thereof.

As described above, the size of each of the notch filters 60A and 60B (the second and third filters) is equivalent to the size of each resonator of the bandpass filters 548a and 548b of the existing technique. Further, since the number of stages of the dielectric coaxial resonators (the number of resonators) in each of the notch filters 60A and 60B (the second and third filters) is smaller than that in each of the band pass filters 548a and 548b of the existing technique, the number of stages of the dielectric coaxial resonators in the present variation is smaller than that in the existing technique by at least two stages.

Then, since the size of a single dielectric coaxial resonator is 70 square millimeters (7 mm×10 mm), and the size of the surface acoustic wave reception-side filter 20B is nine square millimeters (3 mm×3 mm), the size of the surface acoustic wave reception-side filter 20B is smaller than the size of the single dielectric coaxial resonator.

Therefore, in the case where a surface acoustic wave filter is used for the reception-side filter 20B, the total size of the duplexer 1B can be reduced as compared with the existing technique.

The antenna terminal 110 is connected to the terminal L2 of the 90° hybrid 30 and to the antenna element 2.

The terminating resistor 70 is connected to the terminal R2 of the 90° hybrid 40 and to a ground terminal.

Note that an impedance matching circuit may be inserted between the terminating resistor 70 and the terminal R2, and the impedance value of the terminating resistor 70 is not limited to 50Ω. Further, an impedance matching circuit may be disposed instead of the terminating resistor 70.

Note that it may be unnecessary for each of the notch filters 60A and 60B to be a notch filter having filter characteristics in which a single attenuation pole is provided; each of them may be a band elimination filter having filter characteristics in which a predetermined attenuation band is provided, and configured to reflect a radio frequency signal of the reception band and allow a radio frequency signal of the band other than the reception band to pass through. Further, each of the notch filters 60A and 60B may be a low-pass filter configured to reflect a radio frequency signal of a radio frequency band including the reception band and allow a radio frequency signal on a lower frequency side relative to the radio frequency band to pass through, or a high-pass filter configured to reflect a radio frequency signal of a low frequency band including the reception band and allow a radio frequency signal on a higher frequency side relative to the low frequency band to pass through.

Further, the transmission-side filter 10B may not be present depending on the requirement specifications for the present multiplexer.

With the above configuration, a radio frequency signal propagating across a transmission path and a reception path is so demultiplexed by the 90° hybrids 30 and 40 as to be in anti-phase with each other, whereby the stated radio frequency signal is canceled. On the other hand, a radio frequency reception signal propagated from the antenna terminal 110 to the reception path is so demultiplexed by the 90° hybrid 30 as to be in phase with each other, whereby the stated radio frequency reception signal can be propagated with low loss. Further, a radio frequency transmission signal propagated from the transmission path to the antenna terminal 110 is so demultiplexed by the 90° hybrids 30 and 40 as to be in phase with each other, whereby the stated radio frequency transmission signal can be propagated with low loss. According to this configuration, since each of the notch filters 60A and 60B is any one of a band elimination filter, a low-pass filter, and a high-pass filter that are configured to reflect the radio frequency signal of the reception band, it is possible to reduce the size of the duplexer 1B while securing high isolation between the transmission and reception, as compared with a case where the two filters between the 90° hybrids 30 and 40 are configured by band pass filters.

Hereinafter, circuit operations of the duplexer 1A according to the present embodiment will be described. Circuit operations of the duplexer 1B according to the variation on the present embodiment are substantially the same as the circuit operations of the duplexer 1A according to the present embodiment, and therefore description thereof will be omitted.

[1.3 Circuit Operations of Duplexer]

Here, the circuit operations of the duplexer 1A will be described in which the operations are classified into (1) a transmission state of a transmission signal (from the transmission terminal 120 to the antenna terminal 110), (2) a transmission state of a reception signal (from the antenna terminal 110 to the reception terminal 130), and (3) isolation between transmission and reception (from the transmission terminal 120 to the reception terminal 130).

Figure 3:
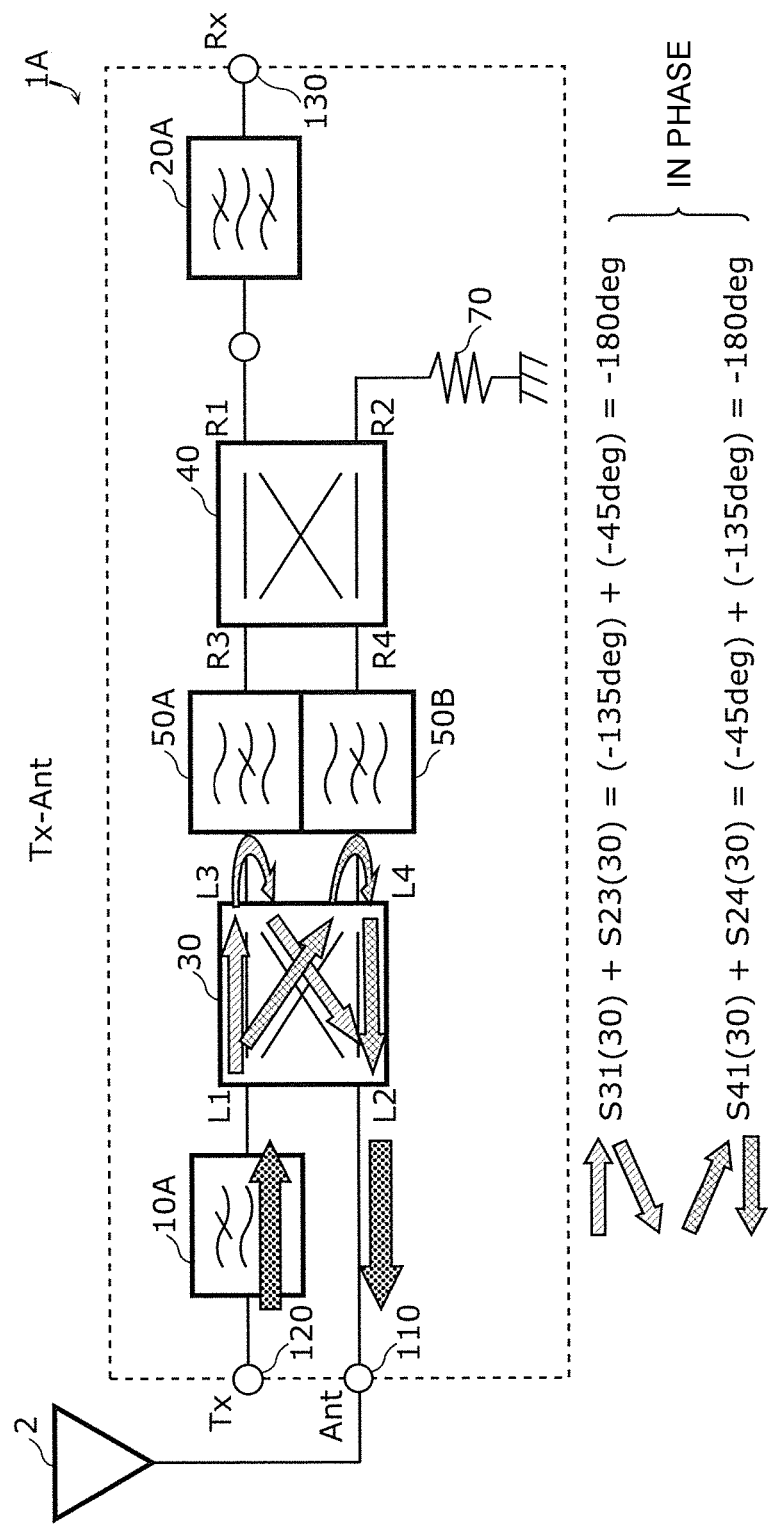
FIG. 3 is a diagram describing a transmission state of a transmission signal in a duplexer according to the first embodiment.

FIG. 3 is a diagram describing a transmission state of a transmission signal in the duplexer 1A according to the first embodiment.

The transmission signal including a frequency component of the transmission band (first pass band) passes through the transmission-side filter 10A and is branched into a first branch signal and a second branch signal at the terminal L1 of the 90° hybrid 30. The first branch signal propagates to the terminal L3, is reflected by the notch filter 50A, and propagates from the terminal L3 to the terminal L2. At this time, loss of transmission characteristics S31 from the terminal L1 to the terminal L3 is 3 dB, and a phase delay thereof is 135 degrees (−135 degrees). Further, a phase delay of transmission characteristics S23 from the terminal L3 to the terminal L2 is 45 degrees (−45 degrees). In other words, the loss of the transmission characteristics of the first branch signal from the terminal L1 to the terminal L2 is 3 dB, and the phase delay thereof is 180 degrees (−180 degrees). Meanwhile, the second branch signal propagates to the terminal L4, is reflected by the notch filter 50B, and propagates from the terminal L4 to the terminal L2. At this time, loss of transmission characteristic S41 from the terminal L1 to the terminal L4 is 3 dB, and a phase delay thereof is 45 degrees (−45 degrees). Further, a phase delay of transmission characteristic S24 from the terminal L4 to the terminal L2 is 135 degrees (−135 degrees). In other words, the loss of the transmission characteristics of the second branch signal from the terminal L1 to the terminal L2 is 3 dB, and the phase delay thereof is 180 degrees (−180 degrees). As a result, since the first branch signal and the second branch signal, which have been decreased by 3 dB each, are combined being in phase at the terminal L2, the transmission signal having a power level almost equal to that of the original transmission signal is restored and is outputted to the antenna element 2 via the antenna terminal 110.

Figure 4:
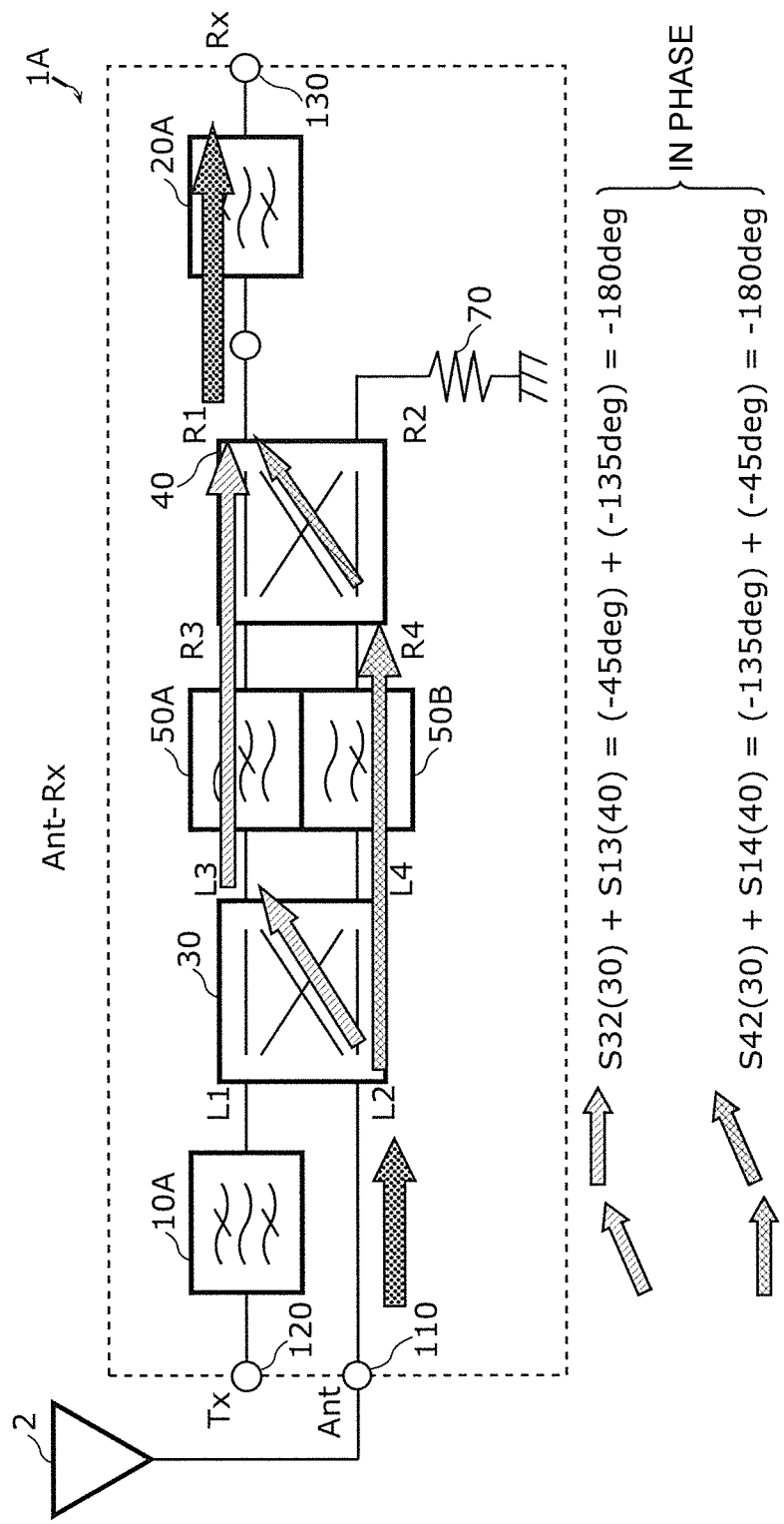
FIG. 4 is a diagram describing a transmission state of a reception signal in a duplexer according to the first embodiment.

FIG. 4 is a diagram describing a transmission state of a reception signal in the duplexer 1A according to the first embodiment.

The reception signal including a frequency component of the reception band (second pass band) is branched into a third branch signal and a fourth branch signal at the terminal L2 of the 90° hybrid 30. The third branch signal propagates to the terminal L3, passes through the notch filter 50A, and propagates to the terminal R1 via the terminal R3 of the 90° hybrid 40. At this time, loss of transmission characteristics S32 from the terminal L2 to the terminal L3 is 3 dB, and a phase delay thereof is 45 degrees (−45 degrees). Further, a phase delay of transmission characteristics S13 from the terminal R3 to the terminal R1 is 135 degrees (−135 degrees). In other words, the loss of the transmission characteristics of the third branch signal from the terminal L2 to the terminal R1 is 3 dB, and the phase delay thereof is 180 degrees (−180 degrees). Meanwhile, the fourth branch signal propagates to the terminal L4, passes through the notch filter 50B, and propagates to the terminal R1 via the terminal R4. At this time, loss of transmission characteristics S42 from the terminal L2 to the terminal L4 is 3 dB, and a phase delay thereof is 135 degrees (−135 degrees). Further, a phase delay of transmission characteristics S14 from the terminal R4 to the terminal R1 is 45 degrees (−45 degrees). In other words, the loss of the transmission characteristics of the fourth branch signal from the terminal L2 to the terminal R1 is 3 dB, and the phase delay thereof is 180 degrees (−180 degrees). As a result, since the third branch signal and the fourth branch signal, which have been decreased by 3 dB each, are combined being in phase at the terminal R1, the reception signal having a power level almost equal to that of the original reception signal is restored. This reception signal passes through the reception-side filter 20A and is outputted from the reception terminal 130.

Figure 5:
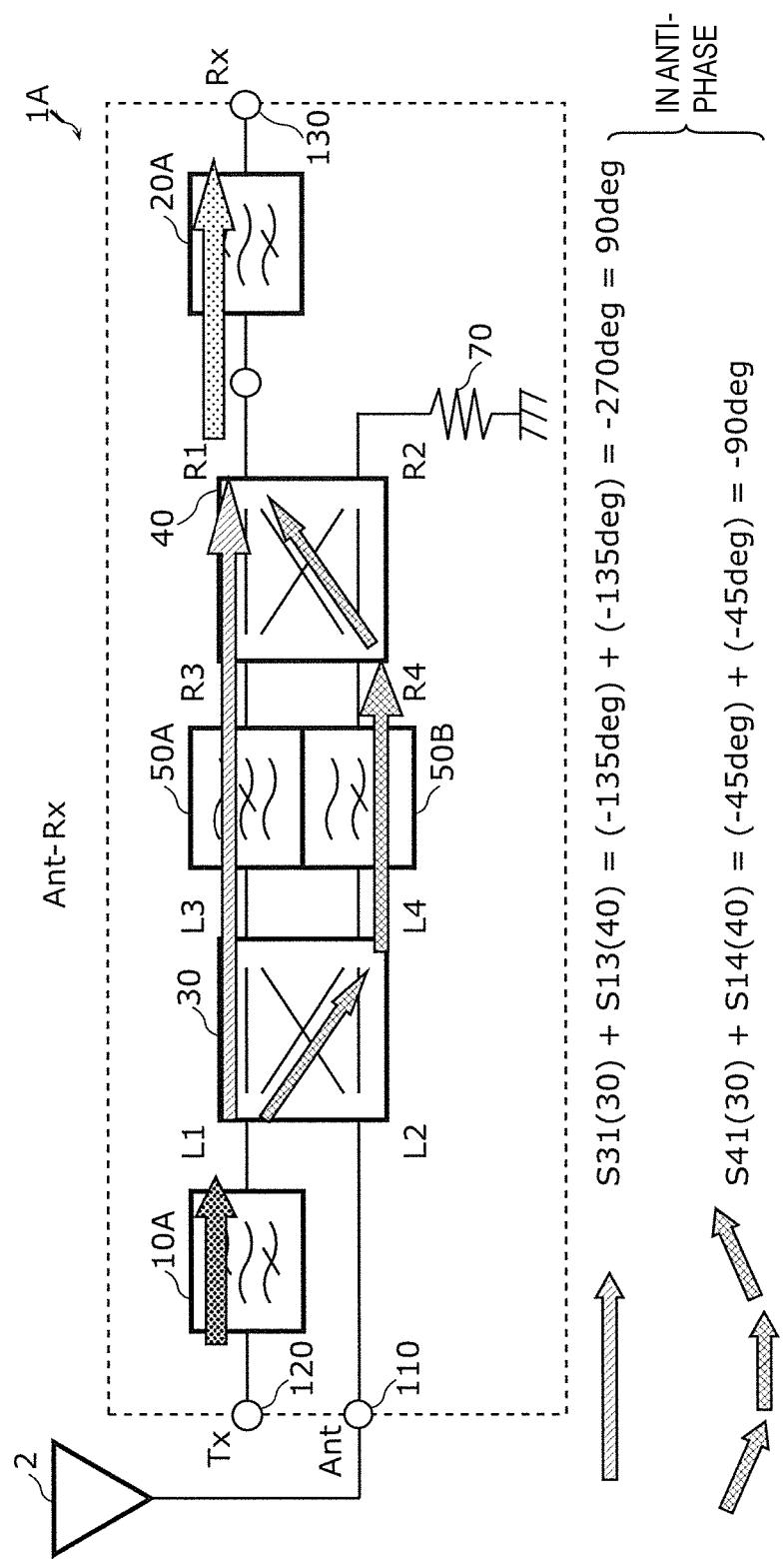
FIG. 5 is a diagram describing isolation between transmission and reception in a duplexer according to the first embodiment.

FIG. 5 is a diagram describing isolation between transmission and reception in the duplexer 1A according to the first embodiment.

A radio frequency signal that has passed through the first filter is branched into a fifth branch signal and a sixth branch signal at the terminal L1 of the 90° hybrid 30. The fifth branch signal propagates to the terminal L3, passes through the notch filter 50A, and propagates to the terminal R1 via the terminal R3. At this time, a phase delay of the transmission characteristics S31 from the terminal L1 to the terminal L3 is 135 degrees (−135 degrees). Further, a phase delay of the transmission characteristics S13 from the terminal R3 to the terminal R1 is 135 degrees (−135 degrees). In other words, the phase delay of the transmission characteristics of the fifth branch signal from the terminal L1 to the terminal R1 is 270 degrees (−270 degrees), to rephrase, a phase advance of 90 degrees (+90 degrees). Meanwhile, the sixth branch signal propagates from the terminal L1 to the terminal L4, passes through the notch filter 50B, and propagates to the terminal R1 via the terminal R4. At this time, the phase delay of the transmission characteristics S41 from the terminal L1 to the terminal L4 is 45 degrees (−45 degrees). Further, a phase delay of the transmission characteristics S14 from the terminal R4 to the terminal R1 is 45 degrees (−45 degrees). In other words, the phase delay of the transmission characteristics of the sixth branch signal from the terminal L1 to the terminal R1 is 90 degrees (−90 degrees). As a result, since the fifth branch signal and the sixth branch signal that have reached the terminal R1 are in anti-phase, the fifth branch signal and the sixth branch signal are canceled at the terminal R1.

Note that the isolation for the radio frequency signal propagating from the reception terminal 130 to the transmission terminal 120 is the same in theory of operation as the isolation for the radio frequency signal propagating from the transmission terminal 120 to the reception terminal 130, and therefore description thereof will be omitted.

The above-discussed circuit operations make it possible for the duplexer 1A to propagate the radio frequency transmission signal from the transmission terminal 120 to the antenna terminal 110 with low loss while eliminating, at a high level, the radio frequency signal propagating between the transmission terminal 120 and the reception terminal 130, and to propagate the radio frequency reception signal from the antenna terminal 110 to the reception terminal 130 with low loss.

[1.4 Effects and so Forth]

As a duplexer required to demultiplex a large amount of radio frequency power, such a configuration can be cited that includes two 90° hybrids 30 and 40 and two filters with the same characteristics in order to reduce the propagation loss of radio frequency signals in adjacent transmission and reception bands between the antenna terminal 110 and the hybrids and filters, and to secure high isolation between the transmission and the reception. According to this configuration, a radio frequency signal propagating across the two signal paths is so demultiplexed by the two 90° hybrids as to be in anti-phase with each other, so that the stated radio frequency signal is canceled. Further, a radio frequency transmission signal propagating from the transmission terminal 120 to the antenna terminal 110 is so demultiplexed by the 90° hybrid 30 as to be in phase with each other, whereby the stated radio frequency transmission signal can be propagated with low loss. Meanwhile, a radio frequency reception signal propagating from the antenna terminal 110 to the reception terminal 130 is so demultiplexed by the 90° hybrids 30 and 40 as to be in phase with each other, whereby the stated radio frequency reception signal can be propagated with low loss.

According to the duplexer 1A according to the present embodiment, each of the two filters disposed between the two 90° hybrids 30 and 40 is any one of a band elimination filter configured to reflect the radio frequency transmission signal, a low-pass filter configured to reflect the radio frequency transmission signal, and a high-pass filter configured to reflect the radio frequency transmission signal.

As a result, it is possible to reduce the size of the overall duplexer 1A while securing high isolation between the transmission and the reception, in comparison with the duplexer of the existing technique in which two filters disposed between two 90° hybrids are each constituted of a band pass filter configured to attenuate both a lower frequency side and a higher frequency side of the pass band.

Further, the two filters disposed between the two 90° hybrids 30 and 40 can be notch filters 50A and 50B each having filter characteristics in which a single attenuation pole is provided in the transmission band.

As a result, since each of the notch filters 50A and 50B is constituted of only a resonator for providing an attenuation pole in the transmission band, the overall duplexer 1A can be further reduced in size as compared with the existing configuration in which the two filters disposed between the two 90° hybrids are each constituted of a band pass filter.

Further, the transmission-side filter 10A and the notch filters 50A, 50B may be a filter constituted of a dielectric resonator including at least one resonator.

This enhances electric power handling capability compared with a case of a surface acoustic wave (SAW or BAW) filter frequently used in cellular phone terminals, and therefore it is possible for the duplexer 1A to be applied as a duplexer disposed in a mobile communication base station or the like.

Further, the duplexer 1A may further include the reception-side filter 20A formed of a dielectric that is connected to the 90° hybrid 40 and is configured to selectively allow a radio frequency signal of the reception band different from the transmission band to pass through; the size of each resonator constituting the transmission-side filter 10A, the size of each resonator constituting the notch filter 50A, and the size of each resonator constituting the notch filter 50B may be substantially equal; the size of each resonator constituting the reception-side filter 20A may be equal to or smaller than the size of each resonator constituting the transmission-side filter 10A, the size of each resonator constituting the notch filter 50A, and the size of each resonator constituting the notch filter 50B; and a total number of the number of resonators constituting the transmission-side filter 10A, the number of resonators constituting the notch filter 50A, the number of resonators constituting the notch filter 50B, and the number of resonators constituting the reception-side filter 20A may be smaller than three times the number of resonators constituting the transmission-side filter 10A.

Thus, the reception-side filter 20A configured to pass the reception band therethrough and reflect the transmission band is disposed in such a manner that the total number of the number of resonators constituting the transmission-side filter 10A, the number of resonators constituting the notch filter 50A, the number of resonators constituting the notch filter 50B, and the number of resonators constituting the reception-side filter 20A is smaller than three times the number of resonators constituting the transmission-side filter 10A. Therefore, as compared with a case where each of the notch filters 50A and 50B is constituted of a band pass filter, even if the reception-side filter 20A, which enhances the bandpass characteristics of the radio frequency signal of the reception band, is disposed, the overall multiplexer can be further miniaturized while securing high isolation of the radio frequency signals of the transmission band and the reception band.

Further, the size of each resonator constituting the transmission-side filter 10A, the size of each resonator constituting the notch filter 50A, and the size of each resonator constituting the notch filter 50B may be substantially equal; the number of resonators of each of the notch filters 50A and 50B may be smaller than the number of resonators of the transmission-side filter 10A; and there may be further provided the reception-side filter 20A of a surface acoustic wave type that is connected to the 90° hybrid 40 and selectively allows the radio frequency signal of the reception band to pass through.

Thus, without necessarily disposing, between the 90° hybrids 30 and 40, a band pass filter that passes the reception band therethrough and attenuates the transmission band, the reception-side filter 20A can be disposed, as a small filter, on the reception terminal 130, which is not required to have high electric power handling capability. Therefore, in comparison with the existing configuration in which each of the two filters disposed between two 90° hybrids is constituted of a band pass filter, even if the reception-side filter 20A, which enhances the bandpass characteristics of the radio frequency reception signal, is disposed, the overall duplexer 1A can be further miniaturized while securing high isolation between the transmission and the reception.

Second Embodiment

In the present embodiment, an arrangement configuration of circuit elements constituting the duplexer 1A according to the first embodiment will be described. The circuit arrangement configuration of the duplexer 1A according to the present embodiment makes it possible to reduce an area and a size of the duplexer.

[2.1 Circuit Arrangement Configuration of Duplexer]

Figure 6:
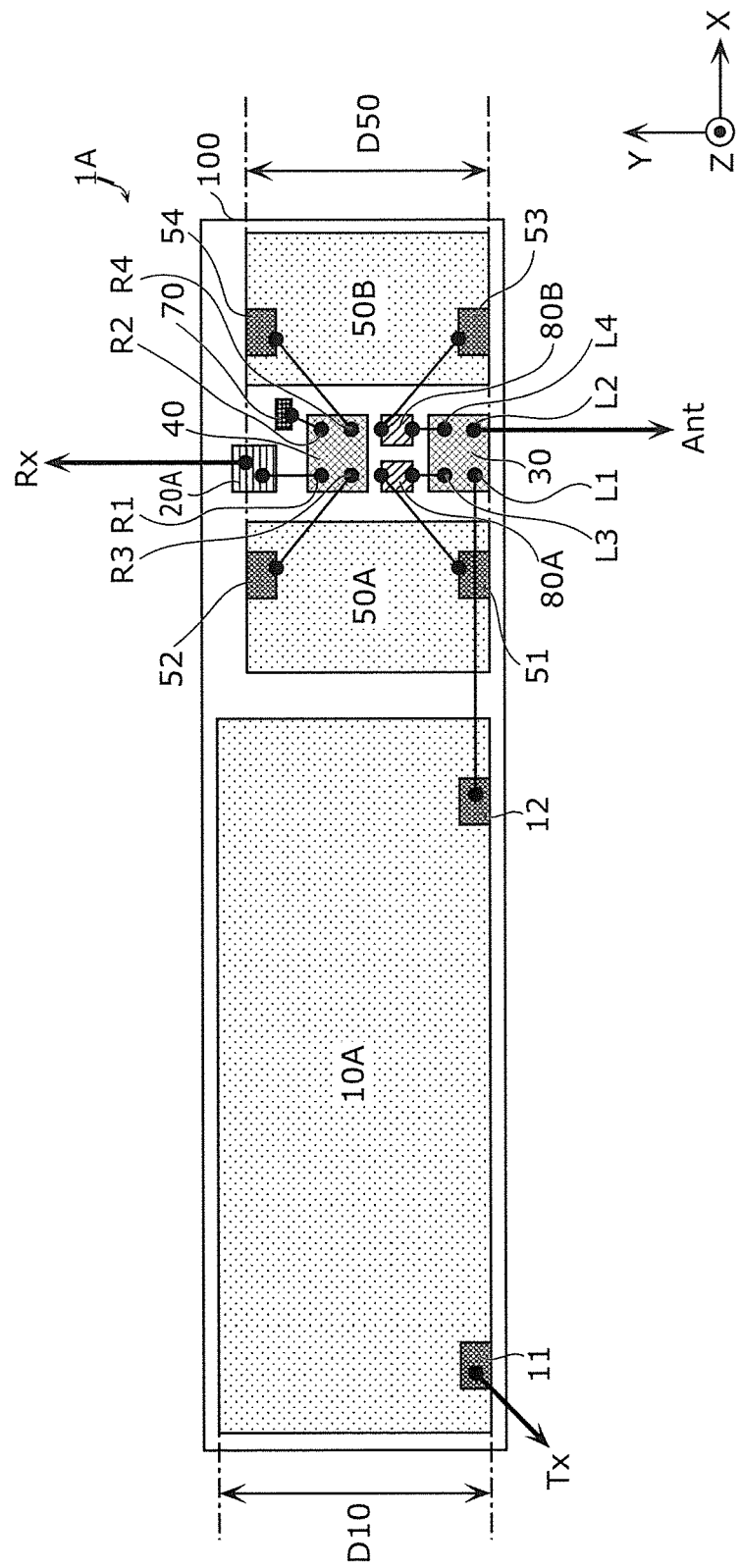
FIG. 6 is a plan view illustrating a circuit arrangement of a duplexer according to a second embodiment.

FIG. 6 is a plan view illustrating the circuit arrangement of the duplexer 1A according to the second embodiment. In addition to the circuit configuration of the duplexer 1A indicated in the first embodiment, the duplexer 1A illustrated in FIG. 6 further includes a mounting board 100 on which 90° hybrids 30 and 40, a transmission-side filter 10A, a reception-side filter 20A, notch filters 50A and 50B, a terminating resistor 70, and matching elements 80A and 80B are mounted. In the duplexer 1A according to this embodiment, the matching elements 80A and 80B are disposed between the 90° hybrid 30 and the notch filters 50A, 50B. The matching elements 80A and 80B are, for example, a phase adjuster, an attenuator or the like, and have a function of adjusting the phase balance and the amplitude balance between a signal path passing through the notch filter 50A and a signal path passing through the notch filter 50B. Note that the matching elements 80A and 80B are not absolutely necessary constituent elements of the duplexer 1A according to the present embodiment.

When the mounting board 100 is seen in a plan view, each of the 90° hybrids 30 and 40, the transmission-side filter 10A, and the notch filters 50A and 50B has a rectangular shape. In addition, in the above-mentioned plan view, (1) the transmission-side filter 10A, (2) the notch filter 50A, (3) the 90° hybrids 30 and 40, and (4) the notch filter 50B are disposed in that order in the longitudinal direction (X-axis direction) of the mounting board 100 (from a negative side toward a positive side of the X-axis direction). Further, a long side of the transmission-side filter 10A, a short side of the notch filter 50A, and a short side of the notch filter 50B are arranged substantially parallel to the longitudinal direction. An input terminal 11 of the transmission-side filter 10A is connected to a transmission terminal 120 disposed on the mounting board 100, and an output terminal 12 of the transmission-side filter 10A is connected to a terminal L1 of the 90° hybrid 30.

As a result of the configuration of the circuit arrangement described above, the notch filters 50A and 50B are disposed such that a distance between an input terminal 51 of the notch filter 50A and an input terminal 53 of the notch filter 50B, and a distance between an output terminal 52 of the notch filter 50A and an output terminal 54 of the notch filter 50B become the shortest across the 90° hybrids 30 and 40.

With this, the total length of wiring connecting the notch filters 50A, 50B and the 90° hybrids 30, 40 can be shortened, so that an area of the mounting board 100 can be reduced and the duplexer 1A can be miniaturized. Further, propagation loss of the radio frequency signal passing through the duplexer 1A can be reduced.

In addition, the transmission-side filter 10A and the notch filter 50A can be disposed in such a manner that a distance between a short side of the transmission-side filter 10A and a long side of the notch filter 50A opposing each other becomes the shortest.

With this, since the transmission-side filter 10A, the notch filters 50A and 50B, and the 90° hybrids 30 and 40 are all disposed at the shortest distance from each other, the area of the mounting board 100 can be further reduced, and the propagation loss of the radio frequency signal passing through the duplexer 1A can be further reduced.

Note that, in the present embodiment, it should be understood that the shortest distance between constituent elements A and B is a distance in which a space needed for mounting the constituent elements A and B, a mounting error, and the like are taken into consideration.

In addition, the length of the wiring connecting the input terminal 51 of the notch filter 50A and the matching element 80A is made equal to the length of the wiring connecting the input terminal 53 of the notch filter 50B and the matching element 80B. Further, the length of the wiring connecting the output terminal 52 of the notch filter 50A and the 90° hybrid 40 is made equal to the length of the wiring connecting the output terminal 54 of the notch filter 50B and the 90° hybrid 40.

Thus, while eliminating, at a higher level, the radio frequency signal propagating between the transmission terminal 120 and the reception terminal 130, it is possible to propagate the radio frequency transmission signal from the transmission terminal 120 to an antenna terminal 110 with a lower loss, and to propagate the radio frequency reception signal from the antenna terminal 110 to the reception terminal 130 with a lower loss.

The antenna terminal 110, the transmission terminal 120 (first external connection terminal), and the reception terminal 130 (second external connection terminal) illustrated in FIG. 1 are disposed on the mounting board 100. Here, in the above-mentioned plan view, the reception-side filter 20A is disposed closest to the reception terminal 130 (second external connection terminal) among the 90° hybrids 30 and 40, the transmission-side filter 10A, the notch filters 50A and 50B, and the reception-side filter 20A.

As a result, since it is possible to shorten the wiring length for connecting the reception-side filter 20A and the reception terminal 130, an area of the mounting board 100 can be reduced and propagation loss between the antenna terminal 110 and the reception terminal 130 can be reduced.

Further, the antenna terminal 110 is disposed between the notch filter 50A and the notch filter 50B in a plan view of the mounting board 100.

As a result, it is possible to shorten the wiring length for connecting the antenna terminal 110 and the 90° hybrid 30, and thus it is possible to reduce the area of the mounting board 100 and reduce the propagation loss between the antenna terminal 110 and the 90° hybrid 30.

In a case where the duplexer 1A according to the present embodiment is mounted in, for example, a base station that processes high power, the transmission-side filter 10A and the notch filters 50A, 50B are required to have high electric power handling capability. To meet this requirement, for each of the transmission-side filter 10A and the notch filters 50A, 50B can be a dielectric filter constituted of a dielectric resonator. Hereinafter, the structure of the dielectric filter will be described.

Figure 7A:
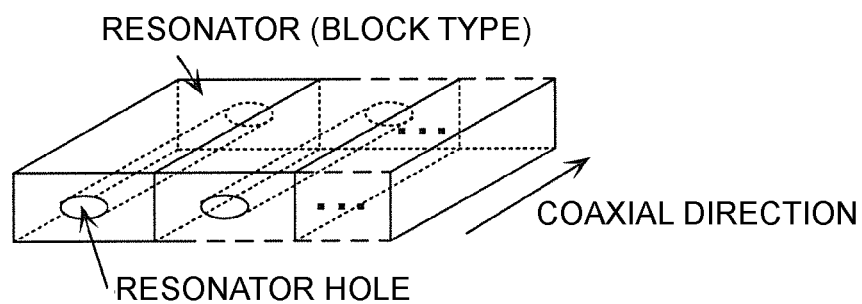
FIG. 7A is a perspective view illustrating a structure of a multiple-block type dielectric filter.
Figure 7B:
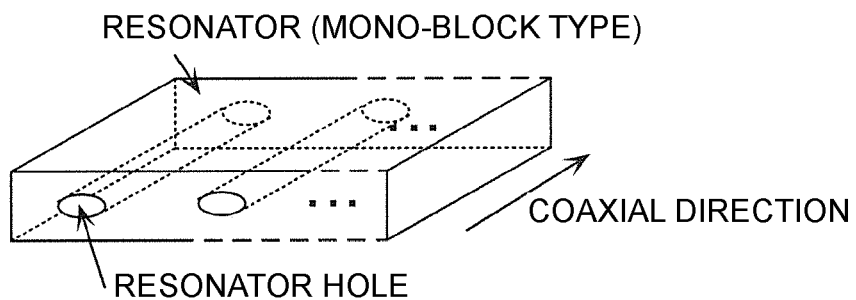
FIG. 7B is a perspective view illustrating a structure of a mono-block type dielectric filter.

FIG. 7A is a perspective view illustrating a structure of a multiple-block type dielectric filter. FIG. 7B is a perspective view illustrating a structure of a mono-block type dielectric filter. In the dielectric filter illustrated in FIG. 7A, multiple blocks, each of which is a rectangular parallelepiped dielectric coaxial resonator (resonator) in which a resonator hole is formed, are disposed adjacent to each other in such a manner that the resonator holes are arranged in parallel. These multiple-block dielectric coaxial resonators (resonators) are electrically coupled to each other by a capacitor, a coil, or the like provided on the board. In the dielectric filter illustrated in FIG. 7B, the multiple-block dielectric coaxial resonators (resonators) illustrated in FIG. 7A are integrated (formed into a mono-block), and the dielectric coaxial resonators (resonators) are magnetically coupled to each other.

In the circuit arrangement configuration of the duplexer 1A illustrated in FIG. 6, the transmission-side filter 10A is, for example, a dielectric filter as illustrated in FIG. 7A or 7B, and is disposed so that a coaxial direction of the dielectric coaxial resonator (resonator) takes a Y-axis direction. Meanwhile, each of the notch filters 50A and 50B is also, for example, a dielectric filter as illustrated in FIG. 7A or 7B, and is disposed so that the coaxial direction of the dielectric coaxial resonator (resonator) takes an X-axis direction. In other words, the transmission-side filter 10A and the notch filters 50A, 50B are disposed such that the coaxial directions of the dielectric coaxial resonators (resonators) thereof are orthogonal to each other.

As described in the first embodiment, the transmission-side filter 10A is a band pass filter, and it is necessary to provide an attenuation band on a lower frequency side and a higher frequency side of the transmission band.

Accordingly, the number of stages of the dielectric coaxial resonators for forming steepness on the higher frequency side and the lower frequency side of the transmission band and for forming the attenuation pole increases. On the other hand, as described in the first embodiment, the notch filters 50A and 50B are notch filters, and are required to provide only the attenuation pole corresponding to the transmission band, so that the number of stages of the dielectric coaxial resonators thereof for constituting the attenuation pole may be smaller than that of the transmission-side filter 10A. From this relationship, it is the transmission-side filter 10A that has the largest influence on the size of the duplexer 1A. Accordingly, in order to miniaturize the duplexer 1A, how to compactly arrange other circuit configurations with respect to the transmission-side filter 10A is important.

From this point of view, the circuit arrangement configuration of the duplexer 1A illustrated in FIG. 6 can be applied in the case where the length of each of the long side of the notch filter 50A and the long side of the notch filter 50B is equal to or smaller than the length of the short side of the transmission-side filter 10A.

Thus, by making a dimension of the mounting board 100 in the short side direction (Y-axis direction) substantially equal to that of the short side of the transmission-side filter 10A, it is possible to reduce a region opposing the long side of the transmission-side filter 10A, thereby making it possible to reduce the area of the mounting board 100.

Even in a case where the length of each of the long side of the notch filter 50A and the long side of the notch filter 50B is longer than the length of the short side of the transmission-side filter 10A, the circuit arrangement configuration of the duplexer 1A illustrated in FIG. 6 may be employed as long as the duplexer 1A can be further miniaturized.

[2.2 Circuit Arrangement Configuration of Duplexer According to Variation 1]

Figure 8:
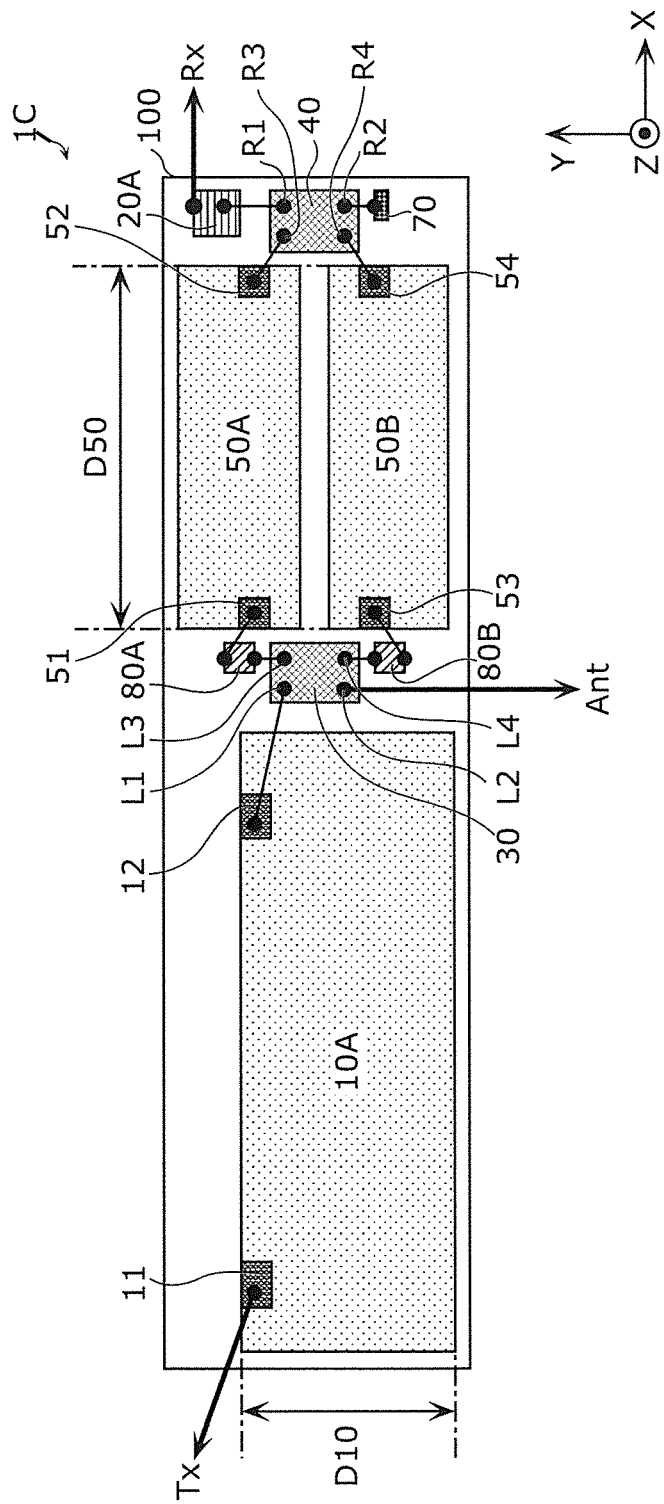
FIG. 8 is a plan view illustrating a circuit arrangement of a duplexer according to Variation 1 on the second embodiment.

FIG. 8 is a plan view illustrating a circuit arrangement of a duplexer 1C according to Variation 1 on the second embodiment. In addition to the circuit configuration of the duplexer 1A indicated in the first embodiment, the duplexer 1C illustrated in FIG. 8 further includes a mounting board 100 on which 90° hybrids 30 and 40, a transmission-side filter 10A, a reception-side filter 20A, notch filters 50A and 50B, a terminating resistor 70, and matching elements 80A and 80B are mounted.

When the mounting board 100 is seen in a plan view, each of the 90° hybrids 30 and 40, the transmission-side filter 10A, and the notch filters 50A and 50B has a rectangular shape. In addition, in the above plan view, (1) the transmission-side filter 10A, (2) the 90° hybrid 30, (3) the notch filters 50A and 50B, and (4) the 90° hybrid 40 are disposed in that order in the longitudinal direction (X-axis direction) of the mounting board 100 (from the negative side toward the positive side of the X-axis direction). Further, a long side of the transmission-side filter 10A, a long side of the notch filter 50A, and a long side of the notch filter 50B are arranged substantially parallel to the longitudinal direction. An input terminal 11 of the transmission-side filter 10A is connected to a transmission terminal 120 disposed on the mounting board 100, and an output terminal 12 of the transmission-side filter 10A is connected to a terminal L1 of the 90° hybrid 30. Further, the long side of the notch filter 50A and the long side of the notch filter 50B are arranged opposing each other.

As a result of the above circuit arrangement configuration, the circuit arrangement is such that a distance between an input terminal 51 of the notch filter 50A and an input terminal 53 of the notch filter 50B and a distance between an output terminal 52 of the notch filter 50A and an output terminal 54 of the notch filter 50B become the shortest.

With this, the total length of wiring connecting the notch filters 50A, 50B and the 90° hybrids 30 and 40 can be shortened, so that an area of the mounting board 100 can be reduced and the duplexer 1C can be miniaturized. Further, propagation loss of the radio frequency signal passing through the duplexer 1C can be reduced.

Further, the transmission-side filter 10A and the 90° hybrid 30 can be disposed in such a manner that a distance between the transmission-side filter 10A and the 90° hybrid 30 becomes the shortest.

As a result, since the transmission-side filter 10A, the notch filters 50A and 50B, and the 90° hybrids 30 and 40 are all disposed at the shortest distance from each other, the area of the mounting board 100 can be further reduced and the propagation loss of the radio frequency signal passing through the duplexer 1C can be further reduced.

In addition, the length of the wiring connecting the input terminal 51 of the notch filter 50A and the matching element 80A is made equal to the length of the wiring connecting the input terminal 53 of the notch filter 50B and the matching element 80B. Further, the length of the wiring connecting the output terminal 52 of the notch filter 50A and the 90° hybrid 40 is made equal to the length of the wiring connecting the output terminal 54 of the notch filter 50B and the 90° hybrid 40.

Thus, while eliminating, at a higher level, the radio frequency signal propagating between the transmission terminal 120 and the reception terminal 130, it is possible to propagate the radio frequency transmission signal from the transmission terminal 120 to an antenna terminal 110 with a lower loss, and to propagate the radio frequency reception signal from the antenna terminal 110 to the reception terminal 130 with a lower loss.

The antenna terminal 110, the transmission terminal 120 (first external connection terminal), and the reception terminal 130 (second external connection terminal) illustrated in FIG. 1 are disposed on the mounting board 100. Here, in the above-mentioned plan view, the reception-side filter 20A is disposed closest to the reception terminal 130 (second external connection terminal) among the 90° hybrids 30 and 40, the transmission-side filter 10A, the notch filters 50A and 50B, and the reception-side filter 20A.

As a result, since it is possible to shorten the wiring length for connecting the reception-side filter 20A and the reception terminal 130, the area of the mounting board 100 can be reduced and the propagation loss between the antenna terminal 110 and the reception terminal 130 can be reduced.

In a case where the duplexer 1C according to the present embodiment is mounted in, for example, a base station that processes large power, the transmission-side filter 10A and the notch filters 50A, 50B are required to have high electric power handling capability. To meet this requirement, for each of the transmission-side filter 10A and the notch filters 50A, 50B can be a dielectric filter constituted of a dielectric resonator.

Since the transmission-side filter 10A is, for example, a band pass filter, and the notch filters 50A and 50B are, for example, notch filters, the number of stages of the dielectric coaxial resonators in each of the notch filters 50A and 50B may be smaller than that in the transmission-side filter 10A. From this relationship, it is the transmission-side filter 10A that has the largest influence on the size of the duplexer 1C. Accordingly, in order to miniaturize the duplexer 1C, how to compactly arrange other circuit configurations with respect to the transmission-side filter 10A is important.

From this point of view, the circuit arrangement configuration of the duplexer 1C illustrated in FIG. 8 can be applied in the case where the length of each of the long side of the notch filter 50A and the long side of the notch filter 50B is longer than the length of the short side of the transmission-side filter 10A.

Thus, by making a dimension in the short side direction (Y-axis direction) of the mounting board 100 substantially equal to a total length of the lengths of the short side of the notch filter 50A and the short side of the notch filter 50B, a region opposing the long side of the transmission-side filter 10A can be reduced, thereby making it possible to reduce the area of the mounting board 100.

The antenna terminal 110 is disposed between the notch filters 50A, 50B and the transmission-side filter 10A in a plan view of the mounting board 100.

As a result, it is possible to shorten the wiring length for connecting the antenna terminal 110 and the 90° hybrid 30, and thus it is possible to reduce the area of the mounting board 100 and reduce the propagation loss between the antenna terminal 110 and the 90° hybrid 30.

Note that, even in a case where the length of each of the long side of the notch filter 50A and the long side of the notch filter 50B is equal to or smaller than the length of the short side of the transmission-side filter 10A, the circuit arrangement configuration of the duplexer 1C illustrated in FIG. 8 may be employed as long as the duplexer 1C can be further miniaturized.

[2.3 Circuit Arrangement Configuration of Duplexer According to Variation 2]

Figure 9:
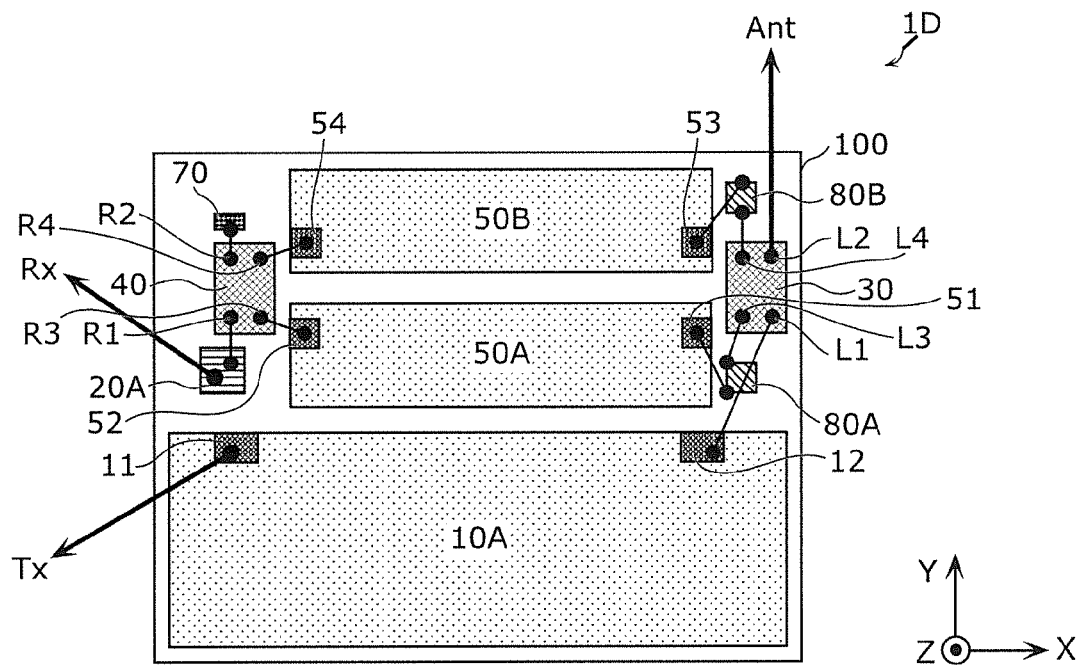
FIG. 9 is a plan view illustrating a circuit arrangement of a duplexer according to Variation 2 on the second embodiment.

FIG. 9 is a plan view illustrating a circuit arrangement of a duplexer 1D according to Variation 2 on the second embodiment. In addition to the circuit configuration of the duplexer 1A indicated in the first embodiment, the duplexer 1D illustrated in FIG. 9 further includes a mounting board 100 on which 90° hybrids 30 and 40, a transmission-side filter 10A, a reception-side filter 20A, notch filters 50A and 50B, a terminating resistor 70, and matching elements 80A and 80B are mounted.

When the mounting board 100 is seen in a plan view, each of the 90° hybrids 30 and 40, the transmission-side filter 10A, and the notch filters 50A and 50B has a rectangular shape. In the above plan view, the notch filters 50A and 50B and the 90° hybrids 30 and 40 are disposed in a region opposing a long side of the transmission-side filter 10A. Further, the notch filters 50A and 50B are disposed between the 90° hybrid 30 and the 90° hybrid 40. An input terminal 11 of the transmission-side filter 10A is connected to a transmission terminal 120 disposed on the mounting board 100, and an output terminal 12 of the transmission-side filter 10A is connected to a terminal L1 of the 90° hybrid 30. The input terminal 11 and the output terminal 12 are disposed on the long side on a side where the 90° hybrids 30 and 40 are disposed among the long sides of the transmission-side filter 10A. Further, the long side of the notch filter 50A and the long side of the notch filter 50B are arranged opposing each other.

Note that, in some case, the input terminal 11 and the output terminal 12 are disposed on the short side of the transmission-side filter 10A, and in this case, the transmission-side filter 10A is disposed so that the input terminal 11 and the output terminal 12 are closer to the notch filters 50A and 50B.

As a result of the above circuit arrangement configuration, the circuit arrangement is such that a distance between an input terminal 51 of the notch filter 50A and an input terminal 53 of the notch filter 50B and a distance between an output terminal 52 of the notch filter 50A and an output terminal 54 of the notch filter 50B become shortest.

With this, the total length of wiring connecting the notch filters 50A, 50B and the 90° hybrids 30, 40 can be shortened, so that an area of the mounting board 100 can be reduced and the duplexer 1D can be miniaturized. Further, propagation loss of the radio frequency signal passing through the duplexer 1D can be reduced.

Further, the transmission-side filter 10A and the notch filter 50A can be disposed so that the distance between the transmission-side filter 10A and the notch filter 50A is shortest.

As a result, since the transmission-side filter 10A, the notch filters 50A and 50B, and the 90° hybrids 30 and 40 are all disposed at the shortest distance from each other, the area of the mounting board 100 can be further reduced and the propagation loss of the radio frequency signal passing through the duplexer 1D can be further reduced.

In addition, the length of the wiring connecting the input terminal 51 of the notch filter 50A and the matching element 80A is made equal to the length of the wiring connecting the input terminal 53 of the notch filter 50B and the matching element 80B. Further, the length of the wiring connecting the output terminal 52 of the notch filter 50A and the 90° hybrid 40 is made equal to the length of the wiring connecting the output terminal 54 of the notch filter 50B and the 90° hybrid 40.

Thus, while eliminating, at a higher level, the radio frequency signal propagating between the transmission terminal 120 and the reception terminal 130, it is possible to propagate the radio frequency transmission signal from the transmission terminal 120 to an antenna terminal 110 with a lower loss, and to propagate the radio frequency reception signal from the antenna terminal 110 to the reception terminal 130 with a lower loss.

The antenna terminal 110, the transmission terminal 120 (first external connection terminal), and the reception terminal 130 (second external connection terminal) illustrated in FIG. 1 are disposed on the mounting board 100. Here, in the above-mentioned plan view, the reception-side filter 20A is disposed closest to the reception terminal 130 (second external connection terminal) among the 90° hybrids 30 and 40, the transmission-side filter 10A, the notch filters 50A and 50B, and the reception-side filter 20A.

As a result, since it is possible to shorten the wiring length for connecting the reception-side filter 20A and the reception terminal 130, the area of the mounting board 100 can be reduced and the propagation loss between the antenna terminal 110 and the reception terminal 130 can be reduced.

In a case where the duplexer 1D according to the present embodiment is mounted in, for example, a base station that processes large power, the transmission-side filter 10A and the notch filters 50A, 50B are required to have high electric power handling capability. To meet this requirement, for each of the transmission-side filter 10A and the notch filters 50A, 50B can be a dielectric filter constituted of a dielectric resonator.

Since the transmission-side filter 10A is, for example, a band pass filter, and the notch filters 50A and 50B are, for example, notch filters, the number of stages of the dielectric coaxial resonators in each of the notch filters 50A and 50B may be smaller than that in the transmission-side filter 10A. From this relationship, it is the transmission-side filter 10A that has the largest influence on the size of the duplexer 1D. Accordingly, in order to miniaturize the duplexer 1D, how to compactly arrange other circuit configurations with respect to the transmission-side filter 10A is important.

In addition, in the above-mentioned plan view, the 90° hybrid 30, among the 90° hybrids 30 and 40, the transmission-side filter 10A, and the notch filters 50A and 50B, is disposed closest to the antenna terminal 110.

As a result, it is possible to shorten the wiring length for connecting the antenna terminal 110 and the 90° hybrid 30, and thus it is possible to reduce the area of the mounting board 100 and reduce the propagation loss between the antenna terminal 110 and the 90° hybrid 30.

Third Embodiment

In this embodiment, a radio frequency front-end circuit and a communication device including the duplexer according to the first embodiment and second embodiment will be described.

[3.1 Configurations of Radio frequency Front-End Circuit and Communication Device]

Figure 10:
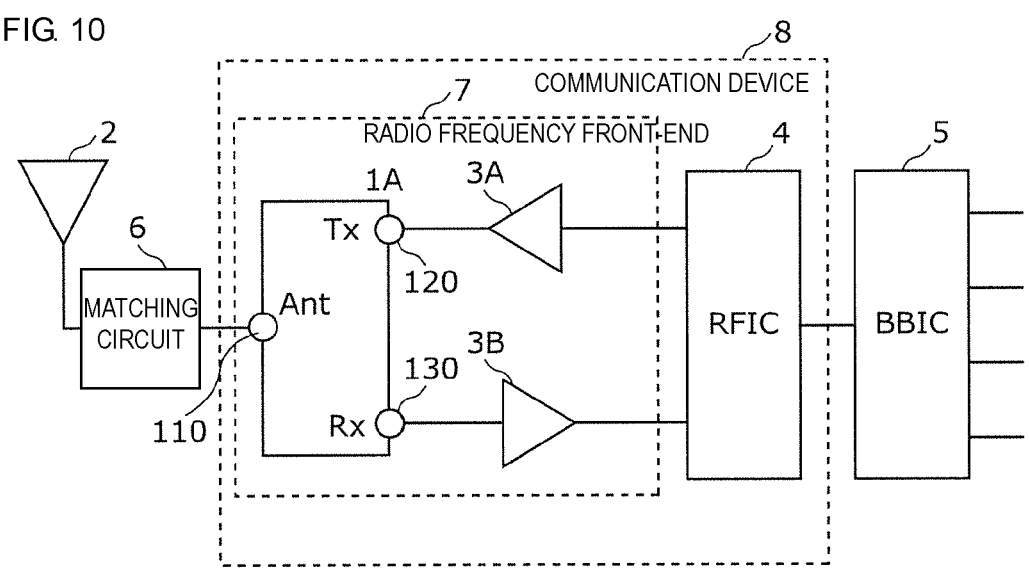
FIG. 10 is a functional block configuration diagram of a communication device and a peripheral circuit thereof according to a third embodiment.

FIG. 10 is a functional block configuration diagram of a communication device 8 and its peripheral circuit according to the third embodiment. In FIG. 10, illustrated are the communication device 8, an antenna element 2, a matching circuit 6, and a baseband signal processing circuit 5. The communication device 8 includes a radio frequency front-end circuit 7 and an RF signal processing circuit 4.

The radio frequency front-end circuit 7 includes a duplexer 1A (or any one of the duplexers 1B to 1D)

according to the first embodiment and second embodiment, a power amplifier circuit 3A, and a low-noise amplifier circuit 3B.

The matching circuit 6 is connected to the antenna element 2 and the duplexer 1A, and performs impedance matching between the antenna element 2 and the radio frequency front-end circuit 7. With this, the radio frequency front-end circuit 7 can receive a reception signal with low loss from the antenna element 2 and output a transmission signal to the antenna element 2 with low loss. The matching circuit 6 is constituted of at least one radio frequency circuit component, that is, constituted of, for example, a chip-formed inductor and a chip-formed capacitor. Note that the matching circuit 6 may be omitted. Further, the matching circuit 6 may be a variable matching circuit configured to vary the impedance in accordance with a band or mode to be selected in the case where the communication device 8 supports multi-band and multi-mode operations.

The power amplifier circuit 3A is an amplification circuit configured to amplify a radio frequency transmission signal outputted from the RF signal processing circuit 4 and output the amplified signal toward the duplexer 1A.

The low-noise amplifier circuit 3B is an amplification circuit configured to amplify a radio frequency reception signal outputted from the duplexer 1A and output the amplified signal to the RF signal processing circuit 4.

The RF signal processing circuit 4 performs signal processing on the radio frequency reception signal inputted from the antenna element 2 through a reception-side signal path by down-conversion or the like, and outputs the reception signal generated by the above signal processing to the baseband signal processing circuit 5. The RF signal processing circuit 4 is, for example, an RFIC (Radio Frequency Integrated Circuit). Further, the RF signal processing circuit 4 performs signal processing on the transmission signal inputted from the baseband signal processing circuit 5 by up-conversion or the like, and outputs the radio frequency transmission signal generated by the signal processing to the power amplifier circuit 3A.

The signal processed by the baseband signal processing circuit 5 is used, for example, as an image signal for image display or as an audio signal for talking.

Note that the radio frequency front-end circuit 7 may further include a transmission-side filter circuit in a transmission-side signal path between the duplexer 1A and the power amplifier circuit. Note that the radio frequency front-end circuit 7 may further include a reception-side filter circuit in the reception-side signal path between the duplexer 1A and the low-noise amplifier circuit 3B.

Here, since the duplexer 1A has the configuration as indicated in the first embodiment and second embodiment, it is possible to provide the miniaturized radio frequency front-end circuit 7 and the miniaturized communication device 8 while securing high isolation between transmission and reception.

Further, the radio frequency front-end circuit 7 may include a multiplexer as described below, instead of the duplexer 1A (or any one of the duplexers 1B to 1D) according to the first and second embodiments. The stated multiplexer includes: a first 90° hybrid that is connected to an antenna terminal, includes a plurality of transmission lines, and is configured to shift, with respect to a radio frequency signal passing through one transmission line of the plurality of transmission lines, a phase of a radio frequency signal passing through another transmission line by approximately 90 degrees; a second 90° hybrid that is connected to a terminating resistor, includes a plurality of transmission lines, and is configured to shift, with respect to a radio frequency signal passing through one transmission line of the plurality of transmission lines, a phase of a radio frequency signal passing through another transmission line by approximately 90 degrees; a first filter connected to the first 90° hybrid and configured to selectively allow a radio frequency signal of a first pass band to pass through; and a second filter and a third filter connected to both the first 90° hybrid and the second 90° hybrid, and mutually having the same filter characteristics, wherein each of the second filter and the third filter is any one of a band elimination filter configured to reflect a radio frequency signal of the first pass band and allow a radio frequency signal of a band other than the first pass band to pass through, a low-pass filter configured to reflect a radio frequency signal of a radio frequency band including the first pass band and allow a radio frequency signal on a lower frequency side relative to the radio frequency band to pass through, and a high-pass filter configured to reflect a radio frequency signal of a low frequency band including the first pass band and allow a radio frequency signal on a higher frequency side relative to the low frequency band to pass through.

Note that the communication device 8 may include a circuit configuration to support the multi-mode/multi-band. In this case, the configuration is such that a plurality of radio frequency front-end circuits 7 are disposed in accordance with the number of frequency bands.

Other Embodiments and so Forth

Thus far, the duplexer (multiplexer), the radio frequency front-end circuit, and the communication device according to the embodiments of the present disclosure have been described while citing the first to third embodiments and the variations; however, the duplexer (multiplexer), the radio frequency front-end circuit, and the communication device of the present disclosure are not limited to the above-described embodiments and variations. Another embodiment achieved by combining arbitrary constituent elements of the above-described embodiments and variations, a variation obtained by performing various kinds of modifications, conceived by those skilled in the art, on the above-described embodiments without necessarily departing from the spirit and scope of the present disclosure, and various types of apparatuses incorporating the duplexer (multiplexer), the radio frequency front-end circuit or the communication device disclosed herein are also included in the present disclosure.

Further, the multiplexer of the present disclosure includes a multiplexer constituted of a plurality of filters including a duplexer, a triplexer, a quadplexer, and the like.

INDUSTRIAL APPLICABILITY

The present disclosure can be widely applied to communication equipment such as a cellular phone and a base station, as a duplexer (multiplexer), a radio frequency front-end circuit, and a communication device that are required to exhibit high electric power handling capability and high isolation.

REFERENCE SIGNS LIST 1A, 1B, 1C, 1D DUPLEXER
2 ANTENNA ELEMENT
3A POWER AMPLIFIER CIRCUIT
3B LOW-NOISE AMPLIFIER CIRCUIT

4 RF SIGNAL PROCESSING CIRCUIT
5 BASEBAND SIGNAL PROCESSING CIRCUIT
6 MATCHING CIRCUIT
7 RADIO FREQUENCY FRONT-END CIRCUIT
8 COMMUNICATION DEVICE
10A, 10B TRANSMISSION-SIDE FILTER
11, 51, 53 INPUT TERMINAL
12, 52, 54 OUTPUT TERMINAL
20A, 20B RECEPTION-SIDE FILTER
30, 40 90° HYBRID
50A, 50B, 60A, 60B NOTCH FILTER
70 TERMINATING RESISTOR
80A, 80B MATCHING ELEMENT
100 MOUNTING BOARD
110 ANTENNA TERMINAL
120 TRANSMISSION TERMINAL
130 RECEPTION TERMINAL
534 TRANSMISSION PATH
542 RECEPTION PATH
546, 550 HYBRID
548a, 548b BAND PASS FILTER

The invention claimed is:

1. A multiplexer comprising:
a first 90° hybrid coupler that is connected to an antenna terminal, that includes a plurality of transmission lines, and that is configured to shift, with respect to a radio frequency signal passing through one of the plurality of transmission lines of the first 90° hybrid coupler, a phase of a radio frequency signal passing through another of the plurality of transmission lines of the first 90° hybrid coupler by approximately 90 degrees;
a second 90° hybrid coupler that is connected to a terminating resistor, that includes a plurality of transmission lines, and that is configured to shift, with respect to a radio frequency signal passing through one of the plurality of transmission lines of the second 90° hybrid coupler, a phase of a radio frequency signal passing through another of the plurality of transmission lines of the second 90° hybrid coupler by approximately 90 degrees;
a first filter connected to the first 90° hybrid coupler and configured to selectively pass a first radio frequency signal of a first pass band; and
a second filter and a third filter, the second and third filters both being connected to both the first 90° hybrid coupler and the second 90° hybrid coupler, and both having the same filter characteristics,
wherein the second filter and the third filter are band elimination filters configured to reflect the first radio frequency signal and pass a second radio frequency signal of a band other than the first pass band, low-pass filters configured to reflect a third radio frequency signal of a band including the first pass band and pass a fourth radio frequency signal of a band lower than the band of the third radio frequency signal, or high-pass filters configured to reflect a fifth radio frequency signal of a low frequency band including the first pass band and pass a sixth radio frequency signal of a band higher than the band of the fifth radio frequency signal.

2. The multiplexer according to claim 1, wherein:
the first 90° hybrid coupler includes a first terminal, a second terminal, a third terminal and a fourth terminal,
the second 90° hybrid coupler includes a fifth terminal, a sixth terminal, a seventh terminal and an eighth terminal,
when a radio frequency signal inputted to the first terminal is outputted to the third terminal and the fourth terminal, a phase difference between the third terminal and the fourth terminal is approximately 90 degrees,
when a radio frequency signal inputted to the second terminal is outputted to the third terminal and the fourth terminal, the phase difference between the third terminal and the fourth terminal is approximately 90 degrees,
when a radio frequency signal inputted to the third terminal is outputted to the first terminal and the second terminal, a phase difference between the first terminal and the second terminal is approximately 90 degrees,
when a radio frequency signal inputted to the fourth terminal is outputted to the first terminal and the second terminal, the phase difference between the first terminal and the second terminal is approximately 90 degrees,
when a radio frequency signal inputted to the fifth terminal is outputted to the seventh terminal and the eighth terminal, a phase difference between the seventh terminal and the eighth terminal is approximately 90 degrees,
when a radio frequency signal inputted to the sixth terminal is outputted to the seventh terminal and the eighth terminal, the phase difference between the seventh terminal and the eighth terminal is approximately 90 degrees,
when a radio frequency signal inputted to the seventh terminal is outputted to the fifth terminal and the sixth terminal, a phase difference between the fifth terminal and the sixth terminal is approximately 90 degrees,
when a radio frequency signal inputted to the eighth terminal is outputted to the fifth terminal and the sixth terminal, the phase difference between the fifth terminal and the sixth terminal is approximately 90 degrees,
each of the first filter, the second filter, and the third filter includes a first input-output terminal and a second input-output terminal,
the first terminal is connected to the second input-output terminal of the first filter,
the second terminal is connected to the antenna terminal,
the third terminal is connected to the first input-output terminal of the second filter,
the fourth terminal is connected to the first input-output terminal of the third filter,
the sixth terminal is connected to the terminating resistor,
the seventh terminal is connected to the second input-output terminal of the second filter, and
the eighth terminal is connected to the second input-output terminal of the third filter.

3. The multiplexer according to claim 1, wherein each of the second filter and the third filter is a notch filter configured to reflect the first radio frequency signal.

4. The multiplexer according to claim 1, wherein each of the first filter, the second filter, and the third filter comprise at least one dielectric resonator.

5. The multiplexer according to claim 4, further comprising:
a fourth filter formed of a dielectric that is connected to the second 90° hybrid coupler and that is configured to selectively pass a seventh radio frequency signal of a second pass band, the second pass band being different from the first pass band,
wherein a size of each resonator of the first filter, a size of each resonator of the second filter, and a size of each resonator of the third filter is substantially equal,
a size of each resonator of the fourth filter is equal to or less than the size of each resonator of the first filter, the size of each resonator of the second filter, and the size of each resonator of the third resonator, and a total number of resonators of the first, second, third, and fourth filters is less than three times a number of resonators of the first filter.

6. The multiplexer according to claim 1, wherein:

a size of each resonator of the first filter, a size of each resonator of the second filter, and a size of each resonator of the third filter is substantially equal, a number of resonators in each of the second filter and the third filter is less than a number of resonators in the first filter, and the multiplexer further comprises a fourth filter, the fourth filter being a surface acoustic wave filter that is connected to the second 90° hybrid coupler and that is configured to selectively pass a seventh radio frequency signal of a second pass band, the second pass band being different from the first pass band.

7. The multiplexer according to claim 5, further comprising:

a mounting board on which the first and second 90° hybrid couplers, the first filter, the second filter, the third filter, and the fourth filter are mounted, wherein the antenna terminal, a first external connection terminal connected to the first filter, and a second external connection terminal connected to the fourth filter are disposed on the mounting board, and wherein the fourth filter is disposed closer to the second external connection terminal than the first and second 90° hybrid couplers, the first filter, the second filter, and the third filter, as seen in a plan view of the mounting board.

8. The multiplexer according to claim 6, further comprising:

a mounting board on which the first and second 90° hybrid couplers, the first filter, the second filter, the third filter, and the fourth filter are mounted, wherein the antenna terminal, a first external connection terminal connected to the first filter, and a second external connection terminal connected to the fourth filter are disposed on the mounting board, and wherein the fourth filter is disposed closer to the second external connection terminal than the first and second 90° hybrid couplers, the first filter, the second filter, and the third filter, as seen in a plan view of the mounting board.

9. The multiplexer according to claim 1, further comprising:

a mounting board on which the first and second 90 hybrid couplers, the first filter, the second filter, and the third filter are mounted, wherein:

each of the first and second 90° hybrid couplers, the first filter, the second filter, and the third filter is formed as a rectangular shape as seen in a plan view of the mounting board, the first filter, the second filter, the first and second 90° hybrid couplers, and the third filter are disposed in such order in a longitudinal direction of the mounting board as seen in the plan view, a long side of the first filter, a short side of the second filter, and a short side of the third filter are arranged substantially parallel to the longitudinal direction, and the second filter and the third filter are disposed such that a shortest distance between input terminals of the second filter and the third filter, and a shortest distance between output terminals of the second filter and the third filter, each cross the first or second 90° hybrid coupler.

10. The multiplexer according to claim 9, wherein the first filter and the second filter are disposed such that a distance between a short side of the first filter and an opposing long side of the second filter is shorter than a distance between the short side of the first filter and an opposing long side of the third filter.

11. The multiplexer according to claim 9, wherein a length of a long side of the second filter and a length of a long side of the third filter are each equal to or shorter than a length of a short side of the first filter.

12. The multiplexer according to claim 9, wherein:

the antenna terminal is disposed on the mounting board, and the antenna terminal is disposed between the second filter and the third filter in the longitudinal direction as seen in the plan view of the mounting board.

13. The multiplexer according to claim 1, further comprising:

a mounting board on which the first and second 90° hybrid couplers, the first filter, the second filter, and the third filter are mounted, wherein:

each of the first and second 90° hybrid couplers, the first filter, the second filter, and the third filter is formed as a rectangular shape as seen in a plan view of the mounting board, the first filter, the first 90° hybrid coupler, the second filter, the third filter, and the second 90° hybrid coupler are disposed in such order in a longitudinal direction of the mounting board as seen in the plan view, a long side of the first filter, a long side of the second filter, and a long side of the third filter are arranged substantially parallel to the longitudinal direction, and the long side of the second filter and the long side of the third filter are arranged opposing each other such that a distance between input terminals of the second filter and the third filter is shorter than a distance between the input terminal of the second filter and an output terminal of the third filter.

14. The multiplexer according to claim 13, wherein the first filter and the first 90° hybrid coupler are disposed such that a distance between the first filter and the first 90° hybrid coupler is shorter than a distance between the first filter and the second 90° hybrid coupler.

15. The multiplexer according to claim 14, wherein a length of the long side of the second filter and the long side of the third filter are each longer than a length of a short side of the first filter.

16. The multiplexer according to claim 13, wherein:

the antenna terminal is disposed on the mounting board, and the antenna terminal is disposed between the first filter and the second and third filters, in the longitudinal direction as seen in the plan view of the mounting board.

17. The multiplexer according to claim 1, further comprising:

a mounting board on which the first and second 90° hybrid couplers, the first filter, the second filter, and the third filter are mounted, wherein:

each of the first and second 90° hybrid couplers, the first filter, the second filter, and the third filter is formed as a rectangular shape as seen in a plan view of the mounting board, the second filter, the third filter, and the first and second 90° hybrid couplers are disposed in a region opposing a long side of the first filter, the second filter and the third filter are disposed between the first 90° hybrid coupler and the second 90° hybrid coupler, and a long side of the second filter and a long side of the third filter are oppose each other such that a distance between input terminals of the second filter and the third filter is shorter than a distance between the input terminal of the second filter and an output terminal of the third filter.

18. The multiplexer according to claim 17, wherein the first filter and the second filter are disposed such that a distance between the first filter and the second filter is less than a distance between the first filter and the third filter.

19. The multiplexer according to claim 7, wherein:

the antenna terminal is disposed on the mounting board, and the first 90° hybrid coupler is disposed closer to the antenna terminal than the second 90° hybrid coupler, the first filter, the second filter, and the third filter, as seen in the plan view.

20. The multiplexer according to claim 8, wherein:

the antenna terminal is disposed on the mounting board, and the first 90° hybrid coupler is disposed closer to the antenna terminal than the second 90° hybrid coupler, the first filter, the second filter, and the third filter, as seen in the plan view.

* * * * *

UNITED STATES PATENT AND TRADEMARK OFFICE
CERTIFICATE OF CORRECTION

PATENT NO.       : 10,484,039 B2
APPLICATION NO.  : 16/199619
DATED            : November 19, 2019
INVENTOR(S)      : Shinya Mizoguchi et al.

Page 1 of 1

It is certified that error appears in the above-identified patent and that said Letters Patent is hereby corrected as shown below:

In the Claims

Column 33, Line 51, Claim 9, "90" should be -- 90° --.

Signed and Sealed this
Twenty-fifth Day of February, 2020

Andrei Iancu
*Director of the United States Patent and Trademark Office*